(12) United States Patent
Kobayashi et al.

(10) Patent No.: US 7,927,657 B2
(45) Date of Patent: Apr. 19, 2011

(54) LIQUID PROCESSING APPARATUS AND LIQUID PROCESSING METHOD

(75) Inventors: Shinji Kobayashi, Kikuchi-gun (JP); Tetsushi Miyamoto, Kikuchi-gun (JP); Masahito Hamada, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/492,650

(22) Filed: Jun. 26, 2009

(65) Prior Publication Data
US 2009/0263577 A1 Oct. 22, 2009

Related U.S. Application Data

(62) Division of application No. 10/796,179, filed on Mar. 10, 2004, now Pat. No. 7,566,365.

(30) Foreign Application Priority Data

Mar. 10, 2003 (JP) ................................ 2003-063852

(51) Int. Cl.
B05D 3/12 (2006.01)
(52) U.S. Cl. .......... 427/240; 427/378; 427/425; 118/52; 118/63; 118/64; 118/320
(58) Field of Classification Search ............... 427/240, 427/425, 378; 118/52, 320, 64, 63
See application file for complete search history.

(56) References Cited

U.S. PATENT DOCUMENTS

| 4,748,053 A | * | 5/1988 | Okada ........................... 427/240 |
| 5,518,542 A | | 5/1996 | Matsukawa et al. |
| 5,762,709 A | * | 6/1998 | Sugimoto et al. ............... 118/52 |
| 6,165,552 A | | 12/2000 | Anai et al. |
| 6,261,378 B1 | | 7/2001 | Hashimoto et al. |
| 6,276,072 B1 | * | 8/2001 | Morad et al. ..................... 34/428 |
| 6,494,220 B1 | | 12/2002 | Matsuda et al. |
| 6,527,860 B1 | | 3/2003 | Yoshihara et al. |
| 6,537,373 B1 | | 3/2003 | Kitano et al. |
| 2005/0016468 A1 | | 1/2005 | Ruhl et al. |

FOREIGN PATENT DOCUMENTS

| JP | 01-236967 | 9/1989 |
| JP | 08-131929 | 5/1996 |
| JP | 2000-271524 | 10/2000 |

* cited by examiner

*Primary Examiner* — Kirsten C Jolley
(74) *Attorney, Agent, or Firm* — Oblon, Spivak, McClelland, Maier & Neustadt, L.L.P.

(57) ABSTRACT

In a liquid processing apparatus for forming a coating film on a polygonal substrate by spin coating in an ambient with a descending clean air flow, a spin chuck includes a support plate for substantially horizontally supporting the substrate thereon. Air flow control members are provided on the spin chuck such that the air flow control member being disposed adjacent to a periphery of the polygonal substrate supported on the spin chuck, wherein the air flow control member is not provided near corner portions of the substrate supported on the spin chuck. The liquid processing apparatus may includes an air flow regulation ring which is provided with an air inlet having an opening surrounding an outer periphery of the air flow control member, wherein the air inlet communicates with the exhaust unit.

8 Claims, 18 Drawing Sheets

LIQUID PROCESSING APPARATUS AND LIQUID PROCESSING METHOD

CROSS-REFERENCE TO RELATED APPLICATIONS

This application is a divisional Application of, and claims the benefit of priority under 35 U.S.C. §120 from, U.S. application Ser. No. 10/796,179, filed Mar. 10, 2004, herein incorporated by reference, which claims the benefit of priority under 35 U.S.C. §119 from Japanese Patent Application No. 2003-063852 filed Mar. 10, 2003.

FIELD OF THE INVENTION

The present invention relates to a liquid processing apparatus and method for use in a liquid process, e.g., a coating process forming a resist film, is performed by supplying a process liquid on a polygonal substrate such as a mask substrate (reticle) which is used upon an exposure process of photolithography.

BACKGROUND OF THE INVENTION

In a manufacture process of a semiconductor device or an LCD, a resist film forming process is photolithographically performed on a substrate to be processed. During such process, a mask substrate having a predetermined pattern lithographed thereon is employed in exposing the substrate to be processed. In order to lithographically form the mask pattern on the surface of the mask substrate, a series of steps are taken: first, a resist is spin coated on the mask substrate made of, e.g., glass, to thereby form a resist film; and then the resist film is exposed and developed, to thereby obtain a desired pattern.

During the spin coating, the substrate G is rotated so that a helical air flow pattern is generated on a surface of the substrate G, to thereby rapidly remove solvent (thinner) ambient from the surface of the substrate G, which in turn facilitates evaporation of the solvent from the coating solution. However, at a portion of the substrate G where a rapid evaporation of the solvent takes place, the processing solution from nearby gets attracted thereto by the surface tension thereof, and as a result, such portion of the substrate G tends to have a greater thickness than that of other portions. In order to resolve such problem, it is desirable that the evaporation rate of the solvent on the surface of the substrate G is uniformly adjusted.

However, in a case of using a polygonal substrate G, as shown in FIG. 1A, peripheral sides of the substrate G rotate cutting through an outer ambient (ambient with low solvent concentration), which in turn facilitates the evaporation taking place at such peripheral sides of the substrate G. As a result, not only a greatest thickness is obtained at the corners of the substrate G, but also a thickness profile slanted towards corners in one direction is obtained at the peripheral sides thereof, as shown in FIG. 1B. These features greatly contribute to a deterioration of thickness profile of the substrate G.

Disclosed in Japanese Patent Laid-open Publication No. 2000-271524 is a spin chuck including a circular plate provided with a depressed portion, i.e., a square recess, in which a substrate is placed, to prevent the ambient from coming into contact with the substrate, and in addition, a method for controlling the air flow pattern upon rotation. Moreover, there is disclosed in Japanese Patent Laid-open Publication No. H8-131929 a method for controlling air flow for a non-polygonal substrate by installing a ring member around a peripheral portion of a semiconductor wafer.

In order to form a pattern with a uniform line width with respect to the mask substrate, there is necessary to secure an in-surface uniformity of a thin film resist layer. However, the conventional spin chuck cannot sufficiently suppress an increase in thickness at the corner portions of the polygonal substrate. An air flow that is produced at a surface of the substrate G during a rotation thereof is considered as a contributing factor in such feature. Accordingly, there is a need to examine a way to adequately control the air flow that occurs at the substrate G.

In addition, with a conventional spin chuck 100, a loading/unloading process of a substrate G is somewhat complicated. Namely, when placing the substrate G onto the spin chuck 100, a substrate G that is carried in by, e.g., a transfer arm, is placed on, e.g., elevating pins protruded through a recess (a depressed portion) 101, and then the transfer arm is retracted and the elevating pins are lowered, to load the substrate G in the recess 101. In such a loading/unloading process, direct loading of the substrate G into the recess 101 is difficult to achieve, and thus such process of loading and unloading the substrate G may become cumbersome. Furthermore, the time required in completing the series of such processes may deteriorate throughput.

SUMMARY OF THE INVENTION

It is therefore an object of the present invention to provide a liquid processing apparatus and method capable of ensuring a uniform thickness of a coated film.

It is another object of the present invention to provide a liquid processing apparatus wherein a loading/unloading of a substrate can easily be carried out.

In accordance with an aspect of the present invention, there is provided a liquid processing apparatus for forming a coating film on a polygonal substrate by spin coating in an ambient with a descending clean air flow, including: a spin chuck including a support plate for substantially horizontally supporting the substrate thereon, the spin chuck rotating the substrate in a substantially horizontal plane; a cup disposed around the substrate supported on the spin chuck; an exhaust unit for evacuating an inside of the cup; a supply nozzle for supplying a coating solution to a top surface of the substrate supported on the spin chuck; and at least one air flow control member provided on the spin chuck, the air flow control member being disposed adjacent to a periphery of the polygonal substrate supported on the spin chuck, wherein the air flow control member is not provided near corner portions of the substrate supported on the spin chuck.

The liquid processing apparatus may further include an air flow regulation ring including an air inlet having an opening surrounding an outer periphery of the air flow control member, wherein the air inlet communicates with the exhaust unit.

With the above-described apparatus of the present invention, in case of drying coating solution on the substrate by rotating the substrate, a helical air flow including evaporative substance flowing from a center portion to a periphery of the substrate along the surface thereof is produced. The helical air flow continuously flows through the top surfaces of corner portions of the substrate. Accordingly, an increment in the film thickness at the corner portions of the substrate is suppressed and, in terms of thickness profile, high in-surface uniformity can be achieved.

In accordance with another aspect of the present invention, there is provided including: a liquid processing method for forming a coating film on a polygonal substrate by spin coating in an ambient with a descending clean air flow, comprising the steps of: (a) supporting the polygonal substrate by a spin chuck and placing at least one air flow control member, which rotates with the spin chuck, along a periphery portion of the substrate except at corner portions thereof; (b) supplying a top surface of the substrate supported on the spin chuck with coating solution and centrifugally spreading the coating solution by rotating the spin chuck about a normal axle; (c) removing a part of the coating solution on the top surface of the substrate by rotating the substrate at a first rotating speed; and (d) evaporating solvent included in the remaining coating solution on the top surface of the substrate by rotating the substrate at a second rotating speed slower than the first rotating speed.

In accordance with further another aspect of the present invention, there is provided including: a liquid processing method for forming a coating film on a polygonal substrate by spin coating in an ambient with a descending clean air flow, comprising the steps of: (a) supporting the polygonal substrate by a spin chuck and placing at least one air flow control member, which rotates with the spin chuck, along a peripheral portion of the substrate except at corner portions thereof; (b) supplying a top surface of the substrate supported on the spin chuck with coating solution and centrifugally spreading the coating solution by rotating the spin chuck about a normal axle; (c) removing a part of the coating solution on the top surface of the substrate by rotating the substrate at a first rotating speed, after stopping the supplying of the coating solution is stopped; and (d) evaporating solvent included in the remaining coating solution on the top surface of the substrate, by rotating the substrate at a second rotating speed slower than the first rotating speed, wherein, at least in the step (d), in addition to an air flow produced by the rotation of the spin chuck, a horizontally outward air flow is produced from a periphery of the air flow control member.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

The preferred embodiments of the present invention will be described in detail with reference to the accompanying drawings.

First Embodiment

Figure 2:
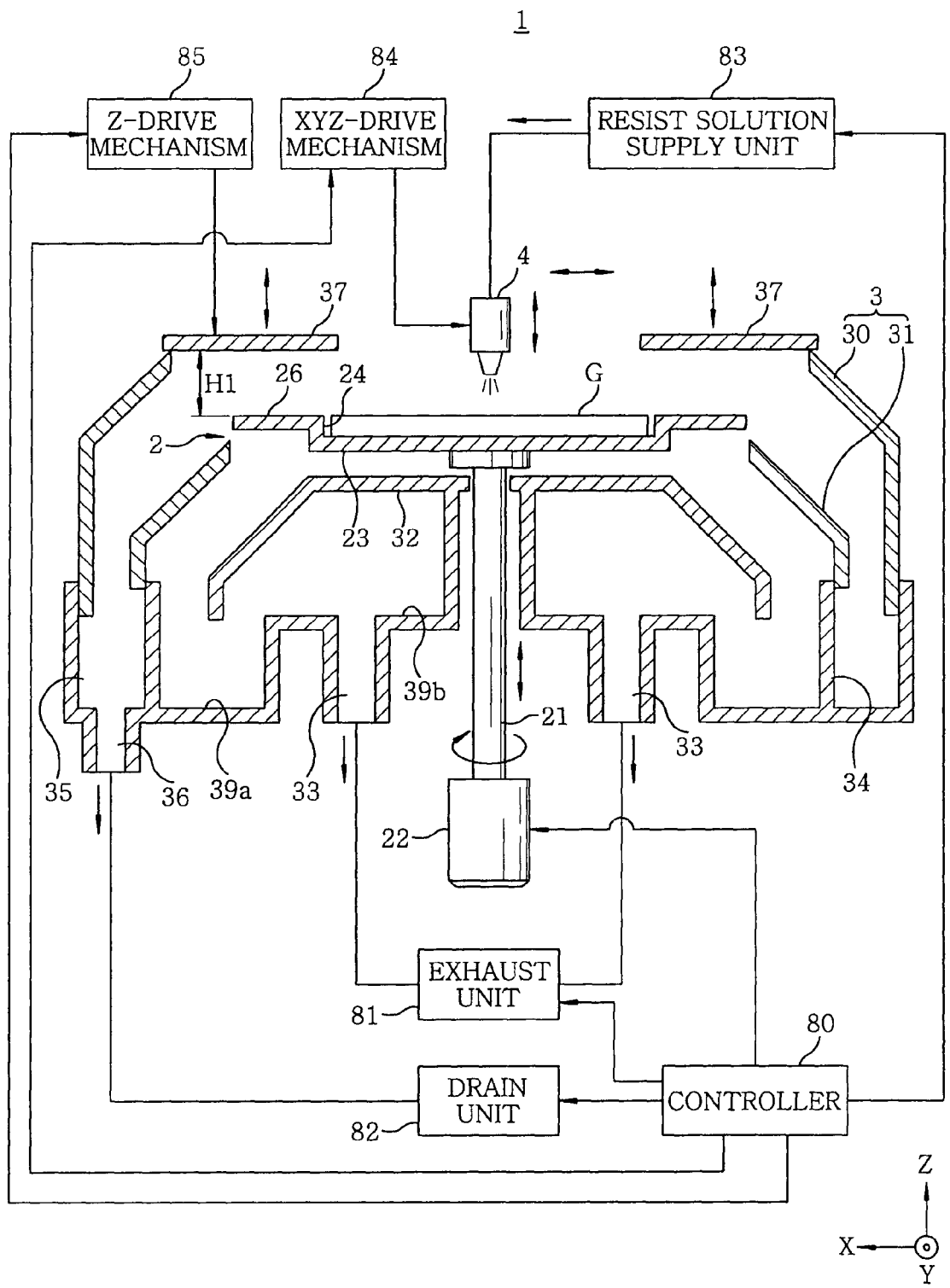
FIG. 2 illustrates a sectional view of a liquid processing apparatus in accordance with a first preferred embodiment of the present invention.

As shown in FIG. 2, a spin chuck 2 is accommodated in a cup 3 of a coating process apparatus 1. The spin chuck 2 receives a mask substrate G as a substrate to be processed from a transfer arm 5 (shown in FIGS. 5 and 8A to 8C) and a predetermined coating process is executed on the substrate G. The substrate G includes a chromium oxide ($Cr_2O_3$) coating film formed on a square quartz plate having a side (L1) of 152±0.4 mm and a resist layer formed thereon, wherein a plate thickness of the substrate G is ¼ inch (6.35±0.1 mm), and a projection length of a C face (13c in FIG. 7A) ranges from 0.2 to 0.6 mm.

The spin chuck 2 is provided with a support plate 23 and air flow control members 26. The support plate 23 includes upright walls 24 and a plurality of spacers 28 to secure the polygonal substrate G; and is connected with a driving member 22 via a rotation axle 21. The driving member 22 is controlled by a controller 80. The driving member 22 is capable of rotating the spin chuck 2 about the Z-axis and vertically moving the spin chuck 2 along the Z-axis.

Figure 3A:
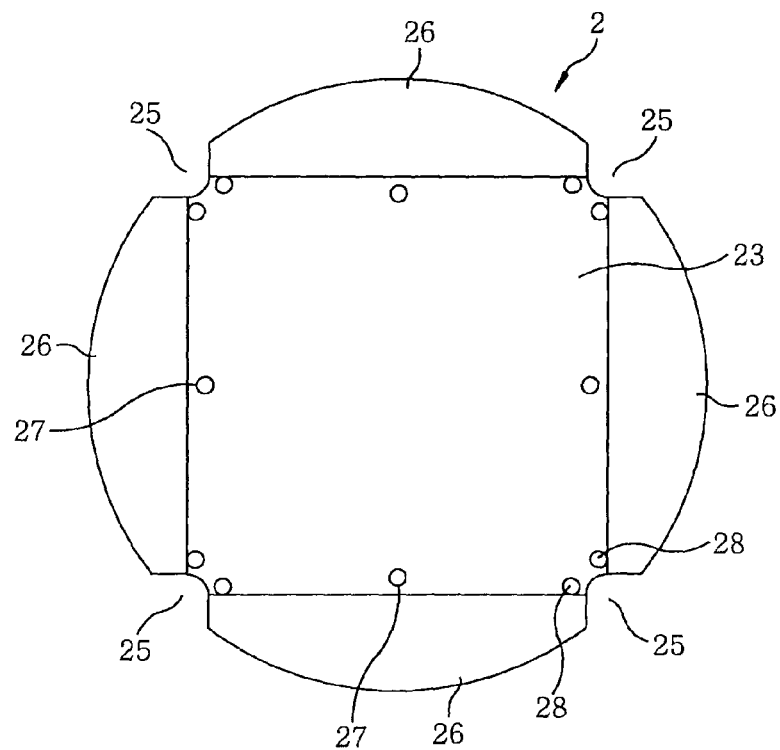
FIG. 3A describes a top view of a spin chuck.
Figure 10A:
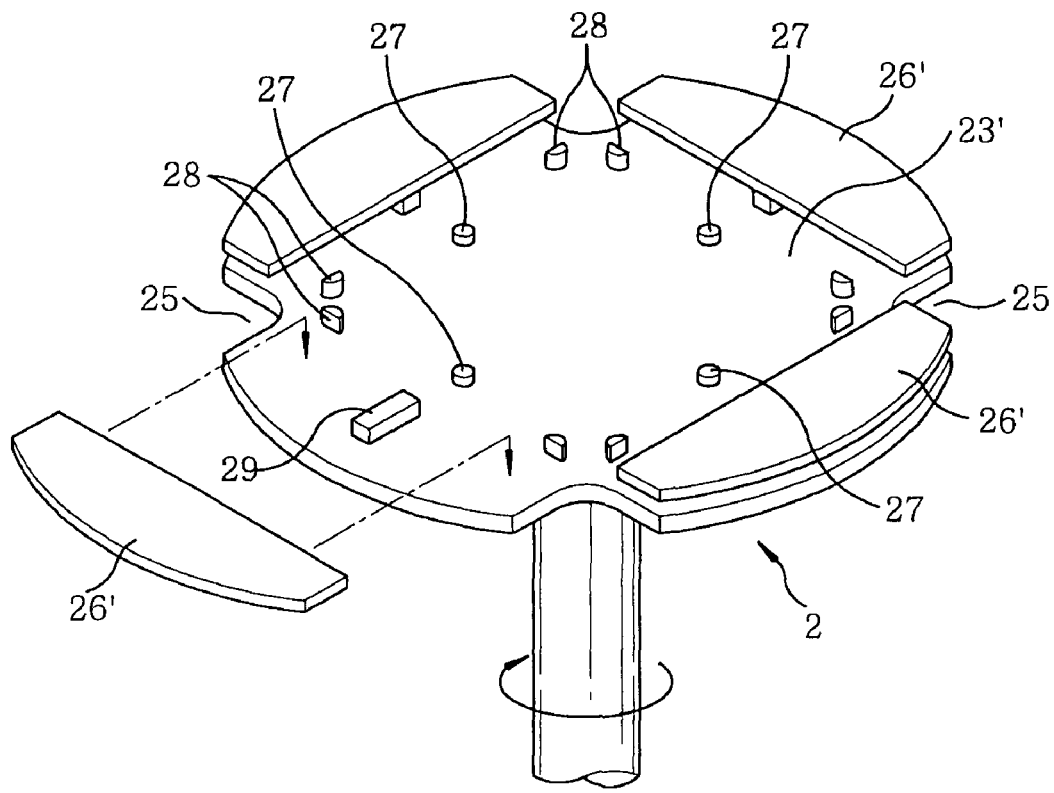
FIG. 10A shows an exploded perspective view of a spin chuck in accordance with another embodiment.
Figure 10B:
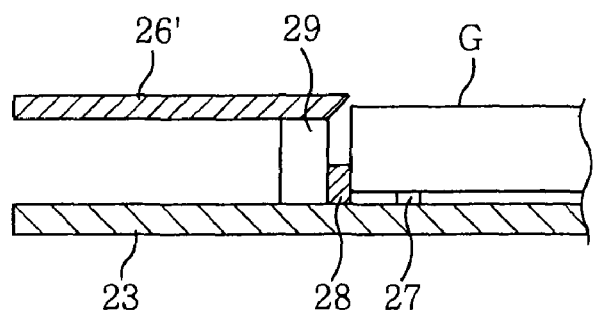
FIG. 10B depicts a partial enlarged section view of the spin chuck in FIG. 10A.

As shown in FIGS. 3A and 10A, there are provided on a top surface of the support plate 23 a number of protrusions (substrate support member) 27 such that they are located near center portions of sides of the substrate G. The protrusions 27 are provided to prevent foreign substances from clinging to a bottom surface of the substrate G, by supporting the bottom surface of the substrate G slightly above a top surface of the support plate 23, as shown in FIG. 10B. Moreover, plural nozzles (not shown) for rinsing a bottom surface of the substrate G is installed at the bottom of support plate 23, such that rinse solution can be ejected from the nozzles through the support plate 23 to cleanse the bottom surface of the substrate G.

Figure 3B:
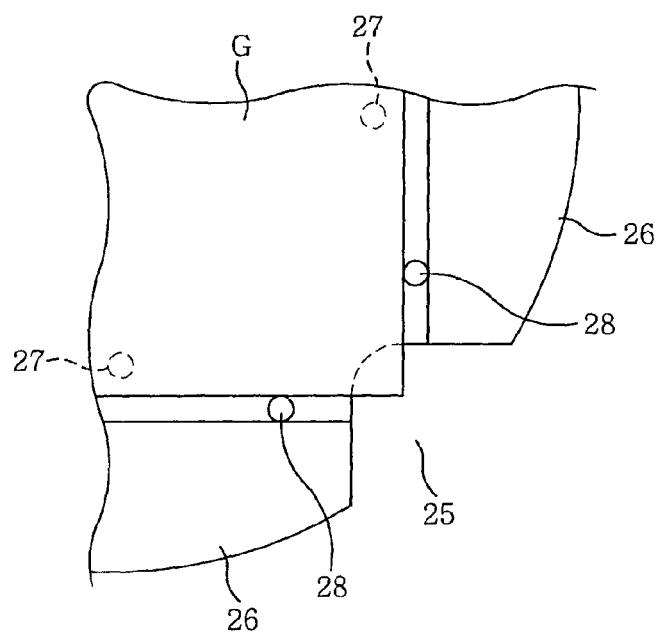
FIG. 3B sets forth a partial enlarged view showing a polygonal substrate supported by the spin chuck.
Figure 4:
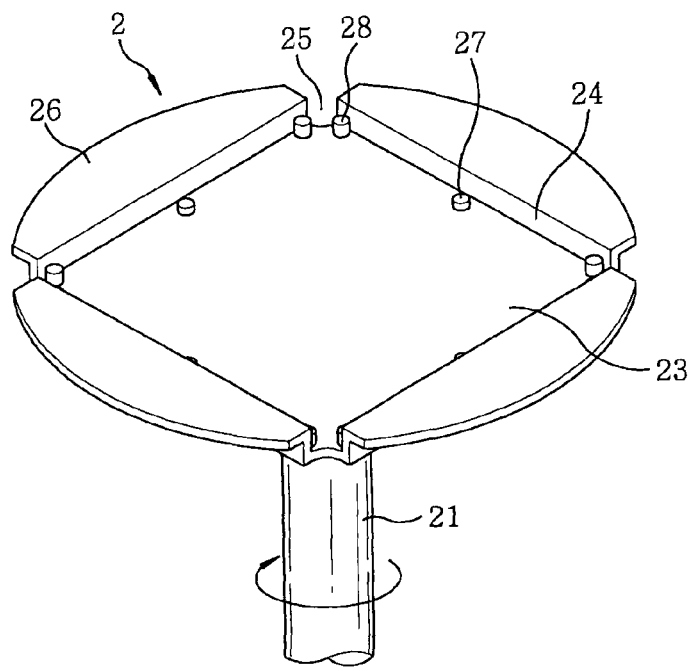
FIG. 4 depicts a perspective view of the spin chuck.
Figure 5:
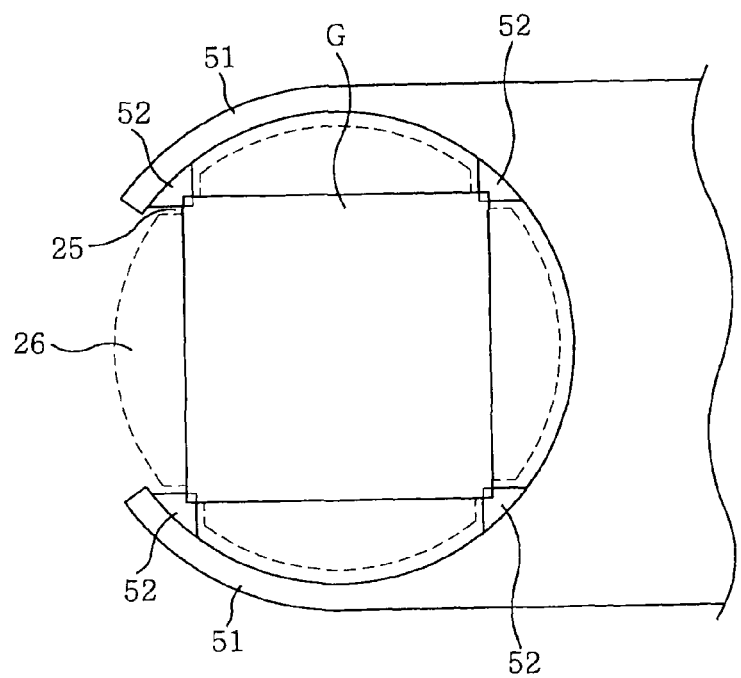
FIG. 5 provides a schematic top view of a transfer arm supporting the substrate.

In addition, there are provided on the top surface of the support plate 23 a pair of spacers 28 at each corner portion thereof, as shown in FIGS. 3A, 3B and 10A. The spacers 28 serve to align the substrate G with the spin chuck 2 and to place the substrate G spaced apart from the upright walls 24 of the spin chuck 2, as shown in FIGS. 3B, 4, and 10B. In other words, due to the spacers 28, the lateral sides 13e (FIG. 7A) of the substrate G do not come in planar contact with the upright walls 24 of the spin chuck.

Furthermore, portions of protrusions 27 and spacers 28 coming in direct contact with the substrate G are coated with polyetheretherketone (PEEK) to prevent scrapes or scratches from occurring on the substrate G. PEEK may include carbon fiber. Additionally, e.g., aluminum, an aluminum alloy, a stainless steel coated with fluororesin, PEEK, or a combination thereof can be employed for other portions of spin chuck in order to prevent generation of foreign substances.

As shown in FIG. 2, there is provided a cup 3 of a first preferred embodiment of the present invention, the cup 3 including an inner cup 31 and an outer cup 30 to surround periphery of the spin chuck 2. The inner cup 31 has a cylindrical lower portion and a truncated upper portion inclined inwardly and upwardly from the lower portion such that opening at a top end of the inner cup 31 is less than that at a bottom end portion thereof. The outer cup 30 is vertically movably supported by an elevating mechanism (not shown). When the outer cup 30 is elevated by the elevating mechanism, the inner cup 31 is interlocked with the outer cup 30 at a portion of movement stroke of the outer cup 30 and is elevated therewith.

Installed below the spin chuck 2 is a circular plate 32. A center portion of the circular plate 32 is penetrated by the rotation axle 21 of the spin chuck. A seal (not shown) is employed to fluid-tightly seal a gap between the rotation axle 21 and the circular plate 32. A peripheral portion of the circular plate 32 has a downward slope, directly under which there are provided a concave portion 39a and a convex portion 39b along the entire circumference thereof, and thereby forming a labyrinth shaped winding fluid channel at a bottom portion of the cup 3.

At a bottom portion of the convex portion 39b there are provided a plural number of exhaust paths 33, which communicate with a suction side of a vacuum pump of an exhaust unit 81. In order to uniformly evacuate the interior of the cup 3, the exhaust paths 33 are arranged at the bottom portion of the convex portion 39b at regular intervals.

Moreover, provided outside the concave portion 39a placed at the bottom surface of the cup is a fluid receptacle 35 with a partition wall 34 disposed therebetween. A bottom surface of the fluid receptacle 35 is outwardly slanted a little and an opening for a liquid drain path 36 is provided at the lowest region of the slanted bottom surface, the liquid drain path 36 communicating with a drain unit 82. Although a single liquid drain path 36 is installed in the present embodiment, two or more liquid drain paths 36 may be provided.

At the labyrinth shaped bottom portion of the cup 3, the drainage fluid, i.e., resist solution and rinsing solution, is separated into liquid and gas. Thus separated gas is discharged to the exhaust unit 81 via the exhaust path 33, whereas the separated liquid is sent to the drain unit 82 via the liquid drain path 36. The operation of the exhaust unit 81 and the drain unit 82 is controlled by the controller 80.

The cup of the present embodiment has a discharging volume of, e.g., 900 inch aqua (260 to 270 Pa), which is about five to six times that of a cup of a silicon wafer coating apparatus. With the present coating apparatus, by making the discharging volume of the cup significantly greater than that of the silicon wafer coating apparatus, even a minute amount of foreign substances is prevented from adhering to the substrate G inside the cup 3.

A ring plate 37 is provided above the cup 3. The ring plate 37 has an inner diameter smaller than the opening of the cup 3, e.g., 100 to 160 mm and an outer diameter greater than the opening of the cup 3. The ring plate 37 is vertically movably supported by a Z-drive mechanism 85.

By shifting the ring plate 37 with the Z-drive mechanism 85 controlled by the controller 80, the distance H1 between a top surface of the air flow control member 26 (or the substrate G on the spin chuck) and a bottom surface of the ring plate 37 is controlled. The distance H1 is a significant parameter along with a flow rate and a velocity of a descending clean air flow, a cup discharging volume, an area of the substrate G, an area and a shape of the air flow control members, an opening area of ventilation holes 25, etc., which influences a uniformity in thickness of a coated resist layer. In the present embodiment, the distance H1 was set as 20 mm. The distance H1 is preferably in a range from about 15 to 40 mm, more preferably in a range from about 20 to 30 mm, and most preferably about 20±1 mm. An excessively large distance H1 reduces the effect of controlling the descending clean air flow. On the other hand, an excessively small distance H1 leads to a disparity in the thickness of the resist layer (deterioration of film thickness uniformity) at a boundary between an area where the descending clean air stream is ejected to and an area where not.

A supply nozzle 4 is provided at a position facing a top surface 13a (FIG. 7A) of the substrate G mounted on the spin chuck 2, for supplying a processing solution, e.g., coating solution such as resist solution, onto the surface of the substrate G. The supply nozzle 4 is movable not only vertically but also forwards and backwards.

Hereinafter, the spin chuck 2 will be described in detail with reference to FIGS. 3A, 3B, and 4.

A substrate mounting portion of the spin chuck 2 is a plate 23 of a substantially polygonal shape slightly greater than the substrate G. The upright wall 24 is formed at each side of the plate along the periphery thereof. That is, the plate 23 and the upright walls 24 form a recessed portion in which the substrate G is placed. In addition, at positions on the plate 23 corresponding to the respective corner portions of a substrate G mounted thereon, there are provided cutout portions 25 each having, e.g., an arc shape. Specifically, at a state wherein the substrate G is mounted on the plate 23, the corner portions of the plate 23 are cut out by, e.g., 7 mm. The cutout portion 25 is preferably in a range from about 4 to 10 mm, more preferably in a range from about 5 to 9 mm, and even more preferably in a range from about 6 to 8 mm. However, the most preferable size of the cutout portion 25 is about 7 mm. If the size of the cutout portion 25 falls below 4 mm, e.g., 3 mm, a thickness of the resist layer in the corner portions becomes greater than that of other portions, as shown in FIG. 1B. Similarly, when the size of the cutout portion 25 exceeds 10 mm, there is a disparity in the thickness of the resist layer in the corner portions.

Provided on a top edge of each of the four upright walls 24 is a wing shaped air flow control member 26, outer rim of which has a shape of an arc. Top surfaces of the air flow control members 26 are generally flush with the top surface of the substrate G and extend outwardly in the XY-plane. The air flow control members 26 surround all four sides of the substrate G, excepting the corner portions thereof. That is, the air flow control members 26 are substantially at the same level as the top surface of the substrate G or may be positioned lower at maximum of 0.5 mm than the latter. The air flow control members 26 are not provided at the corner portions of the substrate G. Furthermore, the top surface of the air flow control members 26 are preferably subjected to surface treatment by, e.g., fluorine coating or Tufram treatment for water repellence, in order to enhance the removal (pealing-off) of the resist solution therefrom.

Furthermore, on the top surface of the plate 23, a protrusion 27 is provided at a position corresponding to, e.g., about a center portion of each side of the substrate G, to support the substrate G slightly above the top surface of the plate 23, to thereby prevent foreign substances from being attached to the bottom surface of the substrate G.

The gap between peripheral sides of the substrate G mounted on the plate 23 and the upright walls 24 is about 1.5±0.2 mm. In the gap, there are provided a plurality of spacers 28 to horizontally support lateral sides of the corner portions of the substrate G, thereby preventing the substrate G from moving when the spin chuck 2 is rotated. The spacers 28 further serve to align the substrate G to a desired position on the spin chuck 2 for the substrate G to be securely maintained thereat. Moreover, portions of protrusions 27 and the spacers 28 coming into contact with the substrate G are coated with, e.g., resin such as PEEK, to thereby protect the substrate G from scratches or scrapes, wherein PEEK may include carbon fiber.

The plate 23 can be a circular plate having a recess on a top surface thereof. Further, a cutout portion 25B (see FIG. 12) may be provided at a position on the plate 23B corresponding to each corner portion of the substrate G. Moreover, ventilation holes 25C (see FIG. 13) may be provided at positions on the plate 23 corresponding to the corner portions of the substrate G, respectively.

Hereinafter, a transfer arm 5 and the mask substrate G will be described in detail with reference to FIGS. 5, 6A, 6B, 7A, 7B, 8A, 8B, and 8C.

The transfer arm 5 includes a horizontal arm member 51 driven by a XYZB-driving mechanism (not shown), for loading/unloading the mask substrate G to/from a spin chuck. The horizontal arm member 51 includes a ring shaped main body having a cutout leading end and four support extrusions 52. The four support extrusions 52 are inwardly protruded from an inner periphery of the ring shaped main body and support a C face 13C of each corner portion of the mask substrate G.

Figure 6A:
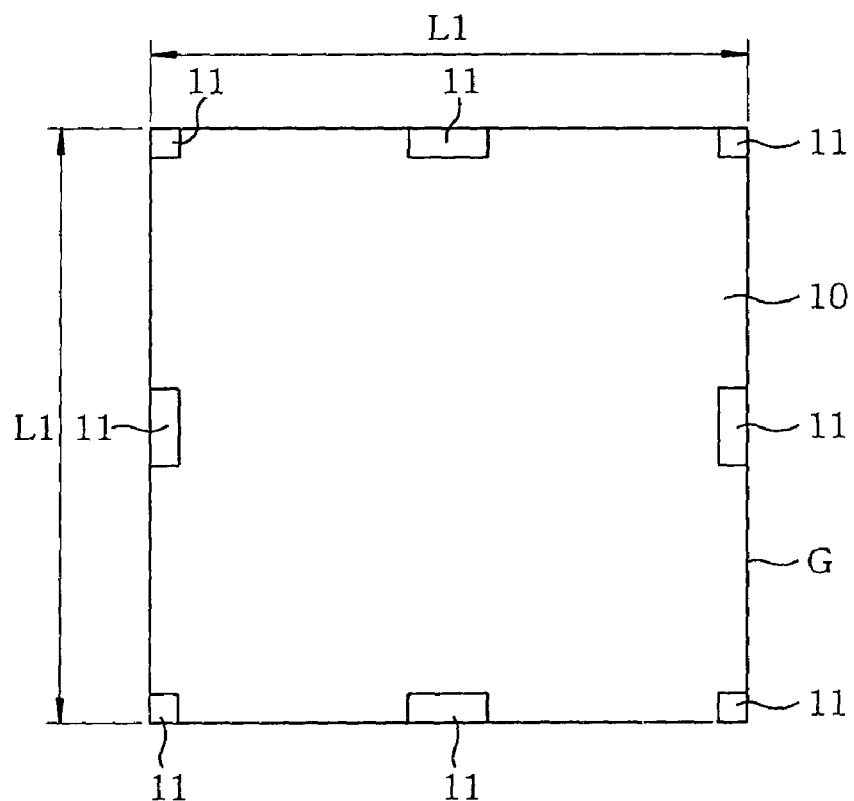
FIGS. 6A and 6B present a top view and a partial sectional view of the substrate, respectively.
Figure 7A:
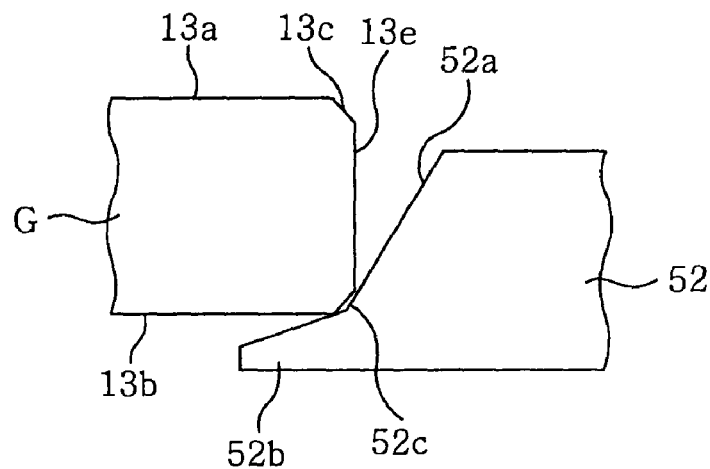
FIGS. 7A and 7B represent an enlarged side view and an enlarged top view showing the substrate supported by supports of the transfer arm, respectively.
Figure 7B:
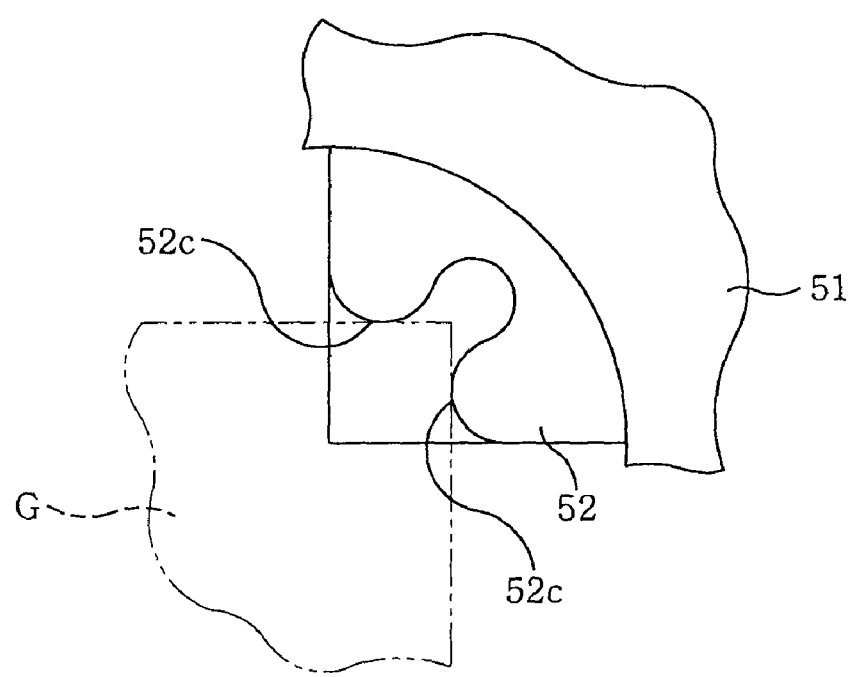

A bottom surface 13b and side surfaces 13e of the mask substrate G are prohibited from being in contact with other objects, to prevent contamination by clinging of foreign substances thereto. Areas 11 of the mask substrate G which are allowed for contact with other objects are limited to only four corner portions and four center portions of the sides as shown in FIG. 6A. Moreover, the support extrusions 52 of the arm member are configured to come into contact only with C faces 13c of the mask substrate G, and substantially not with the bottom surface 13b and the side surfaces 13e of the substrate G, as shown in FIG. 7A. Specifically, each support extrusion 52 includes a tapered guide surface 52a, a leading end stopper portion 52b, and an inflection portion 52c. When the substrate G is received by the transfer arm 5, the substrate G slides along the tapered guide surfaces 52a in a state that only the C faces 13c are in contact therewith, and stops as the C faces 13c reach the inflection portions 52c. A diameter of the inscribed circle of the leading end stopper portions 52b is set to be smaller than that of the circumscribed circle of the mask substrate G, and thus there is no concern for the mask substrate G to be dislodged out of the support extrusions 52. From a plane view, as shown in FIG. 7B, a pair of left and right halves of the inflection portion 52C of each support extrusion 52 contacts the mask substrate G at a corner portion thereof.

Figure 6B:
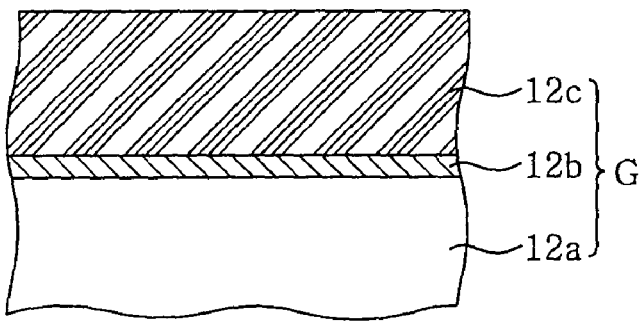

The substrate G, as shown in FIG. 6B, includes a transparent member 12a such as quartz having thereon a chromium oxide ($Cr_2O_3$) coating film 12B on top of which there is a resist coating layer 12C. An average thickness of the chromium oxide ($Cr_2O_3$) coating film 12B ranges from about 30 to 60 nm, and that of the resist coating film 12C ranges from about 400 to 800 nm. Moreover, a length L1 of each side of the mask substrate G is about 152±0.4 mm; a thickness of the substrate G is about ¼ inch (6.35±0.1 mm); and each of a horizontal and a normal projection length of each C face 13c ranges from about 0.2 to 0.6 mm.

Hereinafter, an example for a method of loading and unloading the substrate G by using the transfer arm 5 will be described in short.

Figure 8A:
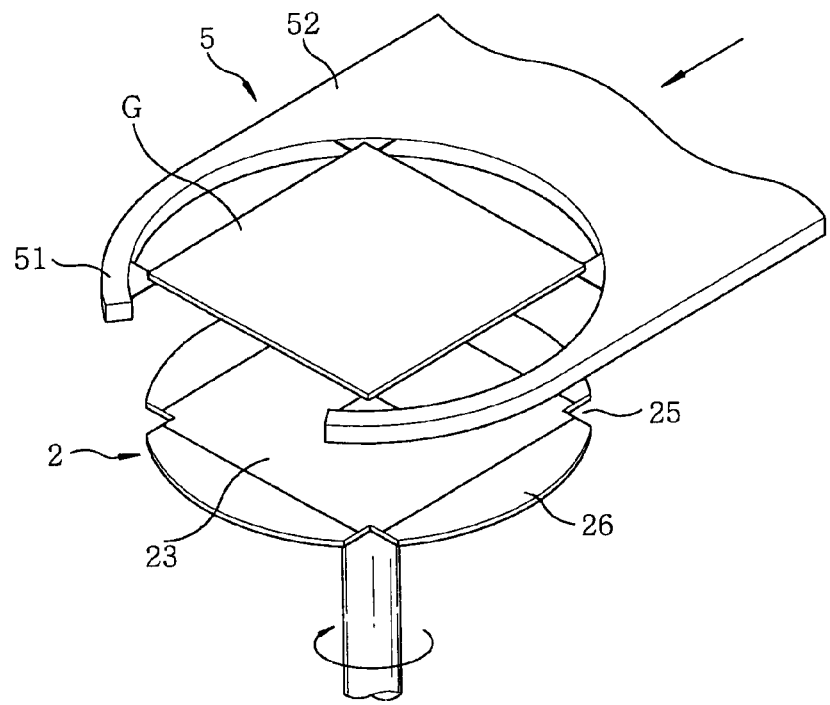
FIGS. 8A to 8C offer perspective views for illustrating a process of loading the substrate to the spin chuck from the transfer arm.

First, as illustrated in FIG. 8A, the transfer arm 5 carrying the substrate G is horizontally moved to a region above the spin chuck 2. The spin chuck 2 is rotated to align the cutout portions 25 with the corner portions of the substrate G mounted on the transfer arm 5.

Figure 8B:
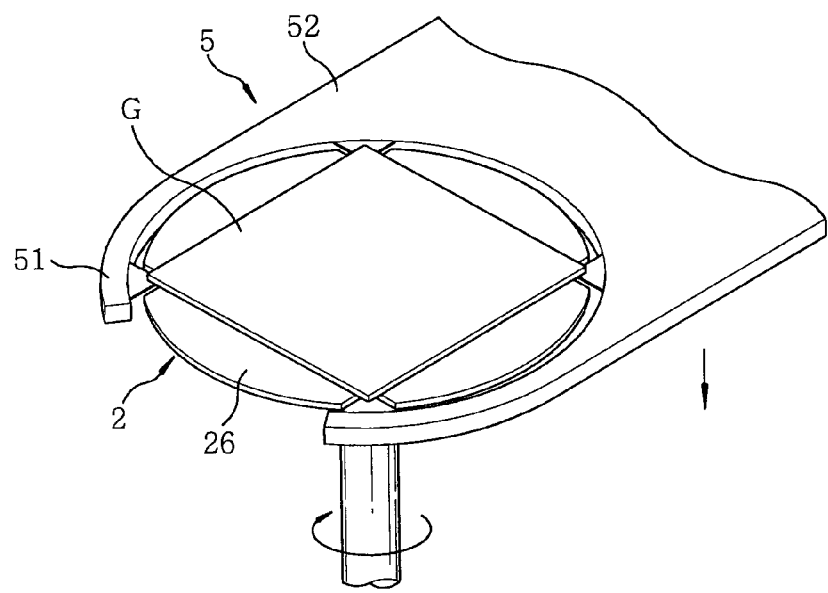
Figure 8C:
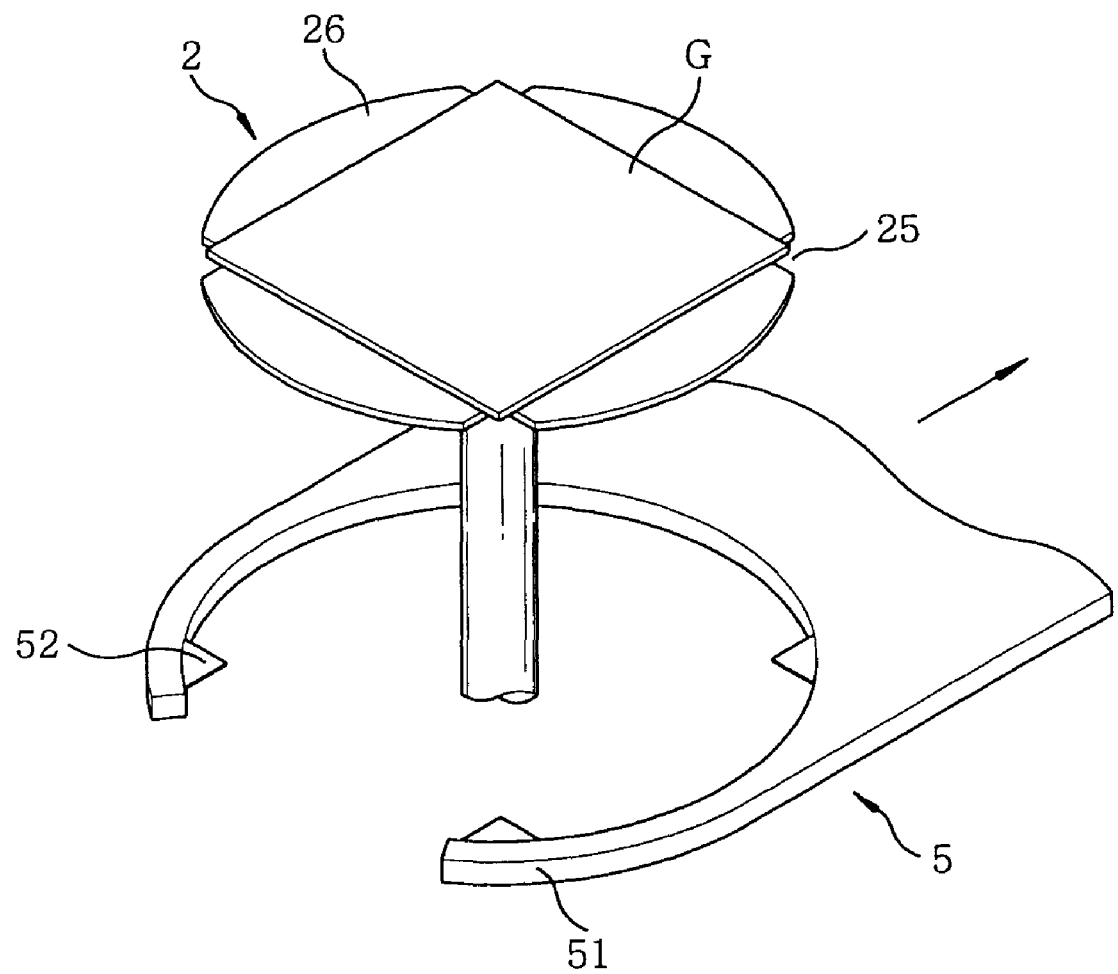

Next, as illustrated in FIG. 8B, while the substrate G is mounted on the transfer arm 5, the transfer arm 5 is lowered such that an area that is surrounded by the arm member 51 meets the spin chuck 2. As the horizontal arm member 51 carrying thereon the substrate G passes around the plate 23 of the spin chuck 2, the substrate G is loaded onto the spin chuck 2. At this time, the substrate G is aligned to a predetermined position by the spacers 28 and the bottom surface thereof is supported by the protrusions 27 so that the substrate G is held on the spin chuck 2. Thereafter, as illustrated in FIG. 8C, when the transfer arm 5 reaches a region below the plate 23, the transfer arm 5 horizontally moves backward passing around the rotation axle 21. When unloading the substrate G from the spin chuck 2 by the transfer arm 5, the above-mentioned process can be performed in a reverse order. Although, in this example, the transfer arm 5 is vertically movable during the operation, the spin chuck 2 may be configured to be vertically movable in lieu thereof or both of them may be made to move vertically relative to each other.

Hereinafter, a method for executing a predetermined liquid processing, e.g., forming a coating layer on a surface of a substrate G, by using the above-mentioned apparatus, will be described in detail.

First, the inner cup 31 and the outer cup 30 are both set at lowered positions and the ring plate 37 is set at an elevated position. Then, the spin chuck 2 is raised up to above the outer cup 30, and by employing the above-mentioned process, the substrate G is transferred from the transfer arm 5 to the spin chuck 2. Subsequently, the inner cup 31 and the outer cup 30 are set at elevated positions, and the ring plate 37 is set above the outer cup 30. Next, a supply nozzle 4 is guided to a position facing a center portion of the substrate G by using a XYZ-drive mechanism 84. While the spin chuck 2 is rotated at a first rotational speed of, e.g., 2500 rpm, for duration of, e.g., 2 to 3 seconds to thereby rotates the substrate G at a high speed, a processing solution of resist solution is discharged toward the center of the substrate G for, e.g., 1.5 seconds, from the supply nozzle 4 through a resist solution supply unit 83. Due to a centrifugal force, the resist solution that has reached the substrate G spreads out to a periphery thereof, and a surplus of the resist solution on the substrate G is removed.

Thereafter, while the supply nozzle 4 is retracted; and, at the same time, the substrate G is rotated at a second rotational speed of a low rotational speed of, e.g., 1000 rpm, for, e.g., 15 to 30 seconds, to thereby facilitate the evaporation of the thinner contained in the resist solution spread on the surface of the substrate G. The remaining resist solution forms a resist film having a thickness of, e.g., 0.6 .mu.m (600 nm), on the surface of the substrate G. Finally, the inner cup 31 and the outer cup 30 are set at the lowered positions; and the spin chuck 2 is raised to transfer the substrate G to the transfer arm 5 for the unloading thereof.

During such spin coating, the surplus resist solution is removed by the high speed rotation and dried by the low speed rotation. In the high speed rotation process, resist solution flows in radial directions of the substrate G and is removed.

On the other hand, in the low speed rotation process, a descending air flow collides with the resist coating film, and the drying action thereof, solvent is eliminated from the resist coating layer. As a result, the resist coating layer is solidified. During the dry solidifying process, the resist solution on the coating layer slightly flows to the periphery, which affects the thickness profile of the coating layer. Since a surplus of the resist solution is eliminated in the previous high speed rotation process and as a result the resist solution on the substrate G forms a thin film thereon, the low speed rotation merely serves a purpose of drying, and thus the inventors of the present invention believe that a descending air flow entering the cup 3 via the ring plate 37 and flowing on the surface of the substrate G from the center to the periphery thereof is what affects the thickness profile rather than the centrifugal force produced during rotation. Although it is clear from an example to be described later that the coating profile is improved by employing the spin coating method described above, the air flow forming mechanism at the surface of the rotating substrate G during the drying process is not experimentally ascertained; and the inventors of the present invention assume the formation of such air flow pattern as follows.

Figure 9:
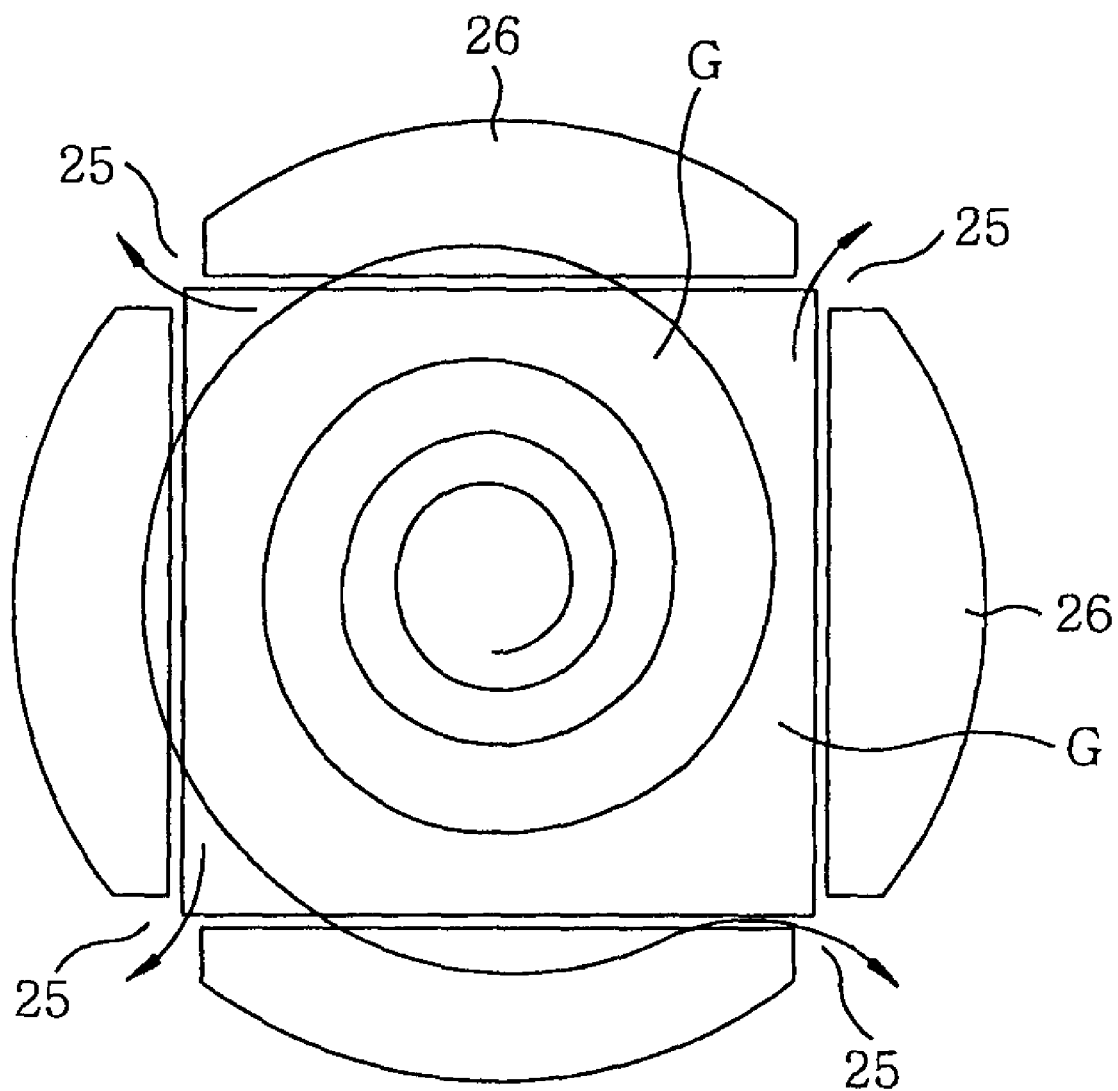
FIG. 9 is a schematic top view illustrating an air flow pattern produced on a top surface of the substrate upon spin drying.

As schematically shown in FIG. 9, when the substrate G is rotated clockwise at a low speed, an apparent air flow that appears to flow counterclockwise relative to the substrate G is produced on the surface of the substrate G. The air containing solvent helically flows along the surface of the substrate G from the center portion toward a periphery thereof. At the periphery of the substrate G, the air flowing outside the substrate G travels along the top surfaces of the air flow control members 26 and returns back to the substrate G. Accordingly, as shown in the drawing, a helical air flow is produced from the center portion of the substrate G to the periphery (corner portions) thereof. As a result, an air flow containing high concentration of solvent reaches even the corner portions of the substrate G. Such air flow changes its direction at places where the air flow control members 26 are not provided and then flows outwardly through (passing through upper parts of) the corner portion of the substrate G in a diagonal direction. Since an air containing high concentration of solvent continuously passes through the upper parts of the corner portions of the substrate G in the diagonal directions thereof, an evaporation of the solvent is suppressed at the corner portions of the substrate G. As a result, the drying rate of the coating film at the corner portions becomes substantially the same as that of other portions, improving uniformity in the thickness of the coating film on the substrate G.

Although in the present embodiment, the resist solution is supplied while rotating the substrate G at the first rotational speed, the resist solution can be supplied, e.g., while the substrate G is at rest, and then the substrate G may be rotated. In this case, spreading and dry-solidifying the resist solution on the surface of the substrate G is performed by a single process.

The above-mentioned embodiment employs an arrangement including a spin chuck 2 that has air flow control members 26 surrounding the periphery of the substrate G with the exception of the corner portions. Therefore, a helical air flow containing high concentration of solvent and flowing along the surface of the substrate G continuously passes through the upper parts of the corner portions. As a result, the evaporation of the solvent is suppressed at the corner portions of the substrate G and, consequently, an in-surface evaporation of the solvent becomes uniform so that an in-surface uniformity even throughout the periphery of the substrate G is obtained. In other words, it is possible to obtain a high precision thickness profile on the surface of the substrate G so that a mask pattern having a uniform line-width can be obtained.

Moreover, in the above-described embodiment, the cutout portions 25 are provided on the spin chuck 2, so that loading and unloading of the substrate G into and from the recessed portion in the spin chuck 2 is facilitated by utilizing the corner portions of the substrate G protruding through cutout portions 25 when transferring the substrate G between the transfer arm 5 and the spin chuck 2. As a result, especially even in a case of repeatedly processing the substrates G, the deterioration of throughput can be suppressed.

In addition, in the above-described embodiment, by installing the ring plate 37 in such a configuration that an air flow is directed toward a position corresponding to the center portion of the substrate G, the air flow entering the cup 3 flows toward a center portion of the substrate G and then is directed outwardly along the surface of the substrate G in parallel thereto; and, as the air flow speed is increased, a formation of turbulent flow at the corner portions of the substrate G can be suppressed. Resultantly, effects of the air flow at the corner portions of the substrate G can be suppressed, thereby resulting in a high precision in-surface thickness profile of the coating film on the substrate G.

Furthermore, in the above-described embodiment, by not providing the air flow control members 26 at the corner portions of the substrate G, even when a resist solution spreads to the gaps between the substrate G and the upright walls 24 during the coating process for example, the solution can be discharged therethrough, thereby preventing a contamination of the bottom surface and the side surfaces of the substrate G. Moreover, such arrangement suppresses attraction of the resist solution spread into the gaps towards the peripheral edges of the substrate G by surface tension thereof during the drying process, thereby suppressing a deterioration of thickness profile.

In case the entire peripheral portions of the substrate G are surrounded by the air flow control members 26, the solution should be removed passing through the air flow control members 26. In this case, there may exist a disparity in the removality of the solution due to, e.g., factors such as surface roughness. However, by not providing the air flow control members 26 at the cutout portions 25 as in the above-described embodiment, such portions can be used in continuously removing the resist solution. As a result, such arrangement offers an advantage of providing a film of solution with a thin film profile of an adequate thickness on the surface of the substrate G.

Moreover, the present invention is not limited to the arrangement wherein the upright walls 24 are provided along the sides of the polygonal support plate 23. As illustrated in FIG. 10A, there may be provided a generally circular plate 23' having a center portion for mounting thereon a substrate, cutout portions 25, and air flow control members 26' each being provided through a protruding spacer 29. In other words, such arrangement provides a gap between the plate 23' and each air flow control member 26'. In such a case, as illustrate in FIG. 10B, it is preferable that an inner end portion of each air flow control member 26' facing the substrate G is of a slanted surface having a downward and outward slant, and the top surface of the substrate G is placed between a top and a bottom end of the inner end portion of the air flow control member 26'. For example, it is preferable that the top surface of the substrate G is located at a level lower than that of the air flow control member 26' (the top of the inner end portion), for example by 0.5 to 1 mm. Under such configuration, the air flow formed on the surface of the substrate G can be regulated and the same results can be achieved as in the above-described case.

Moreover, in such a case, during, e.g., a high speed rotation process, the resist solution removed from the surface of the substrate G is discharged through the gaps provided between the air flow control members 26' and the plate 23'. Accordingly, there are less chances of the resist solution flowing back to the bottom surface of the substrate G and therefore contaminating of the bottom surface of the substrate G and the surfaces of the plate 23' and the protrusion 27 can be suppressed. Further, in comparison with the above-described arrangement, the removability of the resist solution improves in the present case and, therefore, a film solution with an appropriate thin film profile can be formed on the surface of the substrate G.

Hereinafter, a modification of the first embodiment will be described in detail with reference to FIGS. 11A, 11B, 12, 13, and 14.

In the spin coating process, an air flow formed on the surface of the substrate G by rotating the substrate G during the drying phase affects the thickness profile, as described above. Further, in case a different configuration of a cup 3 is used, a different air flow pattern is produced on the surface of the substrate G even though an identical spin chuck 2 is used, which affects the thickness profile. In the present embodiment, based on the fact that a combination of the cup 3 and the spin chuck 2 may cause a synergy effect, the combination of the two is appropriately selected in order to improve the thickness profile.

Figure 11A:
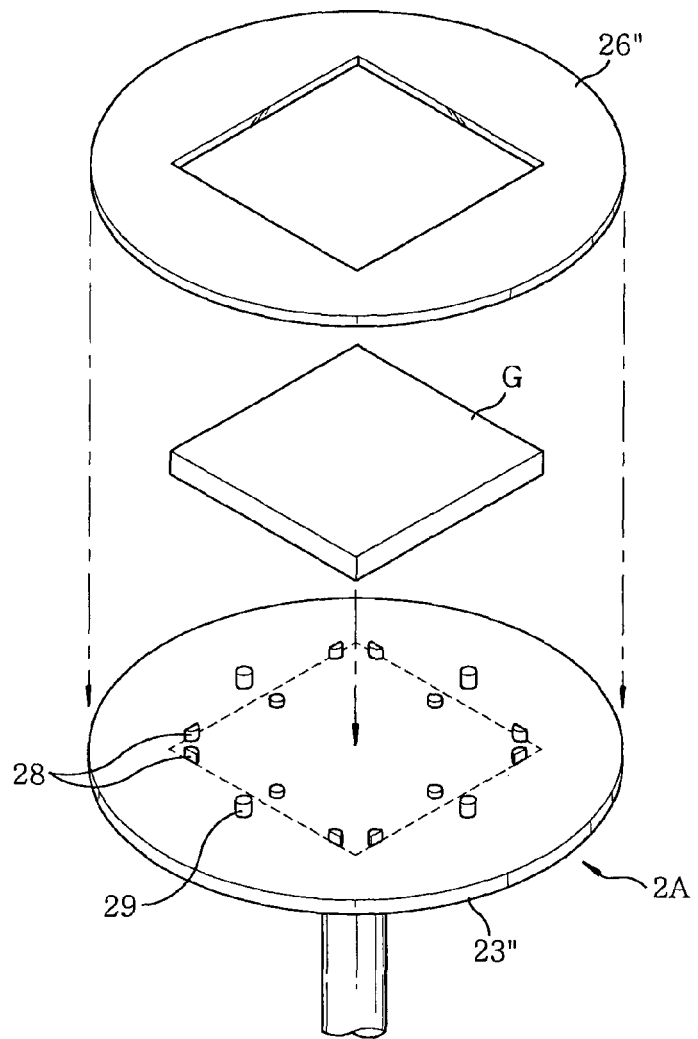
FIG. 11A provides an exploded perspective view of a spin chuck in accordance with further another embodiment.
Figure 11B:
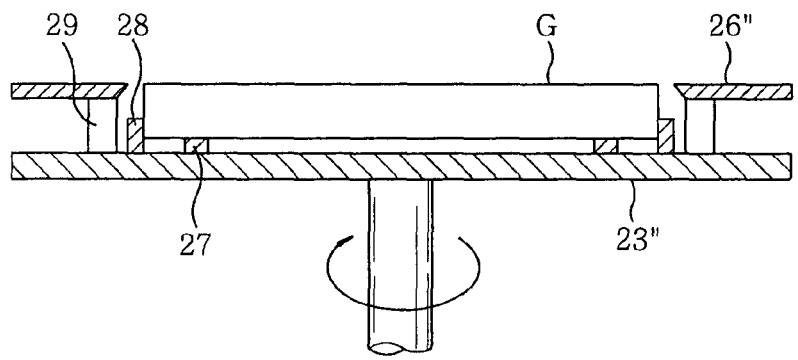
FIG. 11B sets forth a cross sectional view of the spin chuck in FIG. 11A.

There is shown in FIG. 11A a spin chuck 2A including a circular plate 23" for mounting thereon a substrate G, on top of which there is provided via spacers 29 an air flow control member 26" of a circular plate (flat plane) having an opening greater than the substrate G. The spin chuck 2A of the present modified embodiment corresponds to the spin chuck 2 shown in FIG. 10A where the end portions of neighboring air flow control members 26 are connected each other at portions corresponding to the cutout portions 25.

Figure 12:
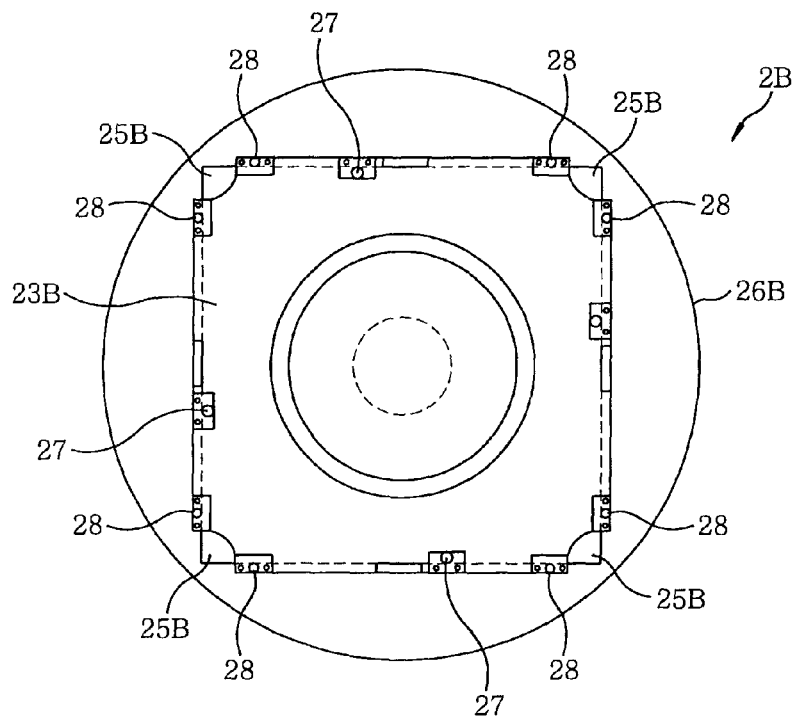
FIG. 12 presents a top view of a spin chuck in accordance with still further another embodiment.

A spin chuck 2B in FIG. 12 includes a substantially square support plate 23B at a bottom portion thereof. Peripheral flanges of the support plate 23B are secured to a periphery of an opening of an air flow control member 26B by using screws. Since the opening of the air flow control member 26B is of a square shape and corner portions of the substantially square support plate 23B are cutout, as viewed from above, there are formed ventilation holes 25B at positions corresponding to the corner portions of the substrate G, respectively. The shape and size of the ventilation holes 25B are determined by a combination of the opening of the air flow control member 26B and the cutout corner portions of the support plate 23B. In the present embodiment, each ventilation hole 25B has a radius ranging from about 5 to 10 mm having a shape of a quarter of a circle.

At the periphery of the opening in the air flow control member 26B, there are provided a plural number of spacers 28 to secure the substrate G on the spin chuck 2B.

Figure 13:
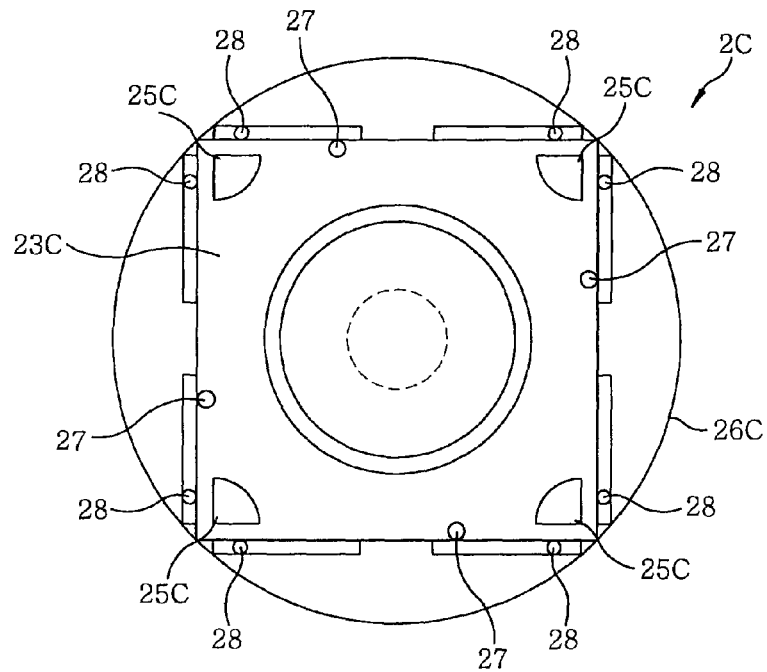
FIG. 13 represents a top view of an air flow control member (hole type) in accordance with still further another embodiment.

A spin chuck 2C shown in FIG. 13 includes a support plate 23C having ventilation holes 25C formed therein instead of the cutout portions. The ventilation holes 25C provide independent openings at four corner portions of the support plate 23C, respectively. That is, the ventilation holes 25C are spaced apart from the periphery of the support plate 23C. In the present embodiment, each ventilation hole 25C has a radius ranging from about 5 to 10 mm in a shape of a quarter of a circle.

Second Embodiment

Hereinafter, a second embodiment of the present invention will be described with reference to FIG. 14. The description of parts that are similar to those in the first embodiment will be omitted.

A cup 6 employed in the second embodiment includes an air flow regulation ring 61 which is placed around an outer periphery of one or more air flow control members 26D of the spin chuck 2D, while maintaining a gap of, e.g., 2 mm therebetween. A flat top surface of the air flow regulation ring 61 is substantially parallel to the top surface of the air flow control members 26D. The air flow regulation ring 61 further includes bottom surface, the bottom surface having a flat inner portion and an outer portion slanted downwardly toward outside. Further, the top surface of the air flow regulation ring 61 is placed at a level slightly, e.g., 1 mm, higher than those of the air flow control members 26D. By surrounding the outer peripheries of the air flow control member 26D, the air flow regulation ring 61 forms an air inlet 61a.

Furthermore, there is provided a circular plate 62 around the rotation axle 21 under the air flow regulation ring 61. A ring member 63 having a generally triangular cross section is provided to surround a periphery of the circular plate 62.

Moreover, through-holes 64 are provided at a top surface of a support plate 23D, through which elevating pins 65 are vertically movably installed to support and elevate the substrate G from bellow, respectively. The elevating pins 65 cooperate with, e.g., the transfer arm 5 to enable loading and unloading of the substrate G.

The drainage fluid (resist solution and rinsing solution) is separated into gas and liquid at a labyrinth shaped bottom portion of the cup 6. Thus separated gas is discharged to the exhaust unit 81 via the gas exhaust path 33, whereas the separated liquid is sent to the drain unit 82 via the liquid drain path 36. The operation of the exhaust unit 81 and the drain unit 82 are both controlled by the controller 80.

By vertically moving the ring plate 37 with the Z-drive mechanism 85 controlled by the controller 80, a distance H2 between a top surface of the air flow regulation ring 61 (or the substrate G mounted on the spin chuck 2D) and a bottom surface of the ring plate 37 can be controlled. In the present embodiment, the distance H2 was set as 25 mm. The distance H2 is preferably in a range from about 15 to 40 mm and more preferably in a range from about 20 to 30 mm.

Under such arrangement of the cup 6 and the spin chuck 2D, when the substrate G is rotated at a low speed, a resist solution removed from the substrate G flows between the air flow regulation ring 61 and the ring member 63 and a horizontally directed air flow is produced from the surface of the substrate G and throughout the air flow regulation ring 61. By producing the horizontally directed air flow at the spin chuck 2D in the present embodiment, despite a lack of a full understanding of the mechanism thereof, a formation of turbulent air flow flowing through the top surfaces of the corners of the substrate G is suppressed. Thus a high in-surface uniformity even throughout the periphery of the substrate G can be achieved as seen from examples to follow and, therefore, the same effects as in the above-mentioned cases are obtained. Further, when performing a high speed rotation process, since a resist solution flowed into a gap between the substrate G and the air flow control members 26D is discharged between the air flow control members 26D and the plate 23D, a contamination of the substrate G or the plate 23D can be prevented and removability of the resist solution is improved, and thereby a desired film of solution with an appropriate thin film profile can be obtained on the surface of the substrate G.

Further, in the present invention, the spin chuck 2D of this embodiment and the first cup 3 shown in FIG. 2 may be combined, and the spin chuck 2 shown in FIG. 3A and the second cup 6 of the present embodiment may be combined.

In the present invention, the substrate G is not limited to the mask substrate but may be, e.g., a glass substrate for a liquid crystal display or a semiconductor wafer. Furthermore, the liquid processing of the present invention is not limited to a coating process of a coating solution process but may be applicable to other process such as a developing processing supplying a developing solution to an exposed substrate G and a cleaning process where a cleaning solution is supplied to a substrate G.

Figure 15:
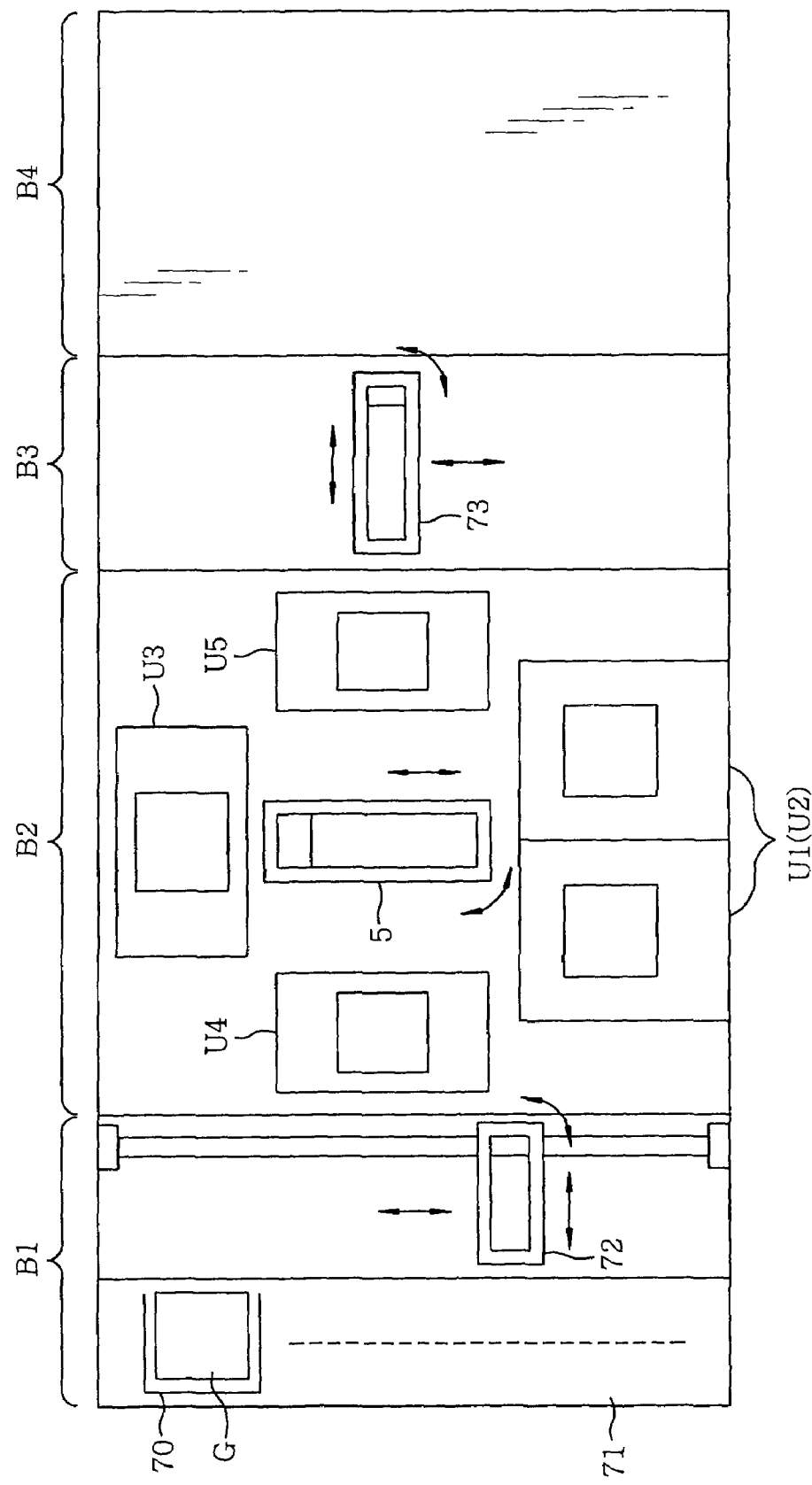
FIG. 15 depicts a schematic top view of a coating/developing apparatus including the liquid processing apparatus of the present invention.
Figure 16:
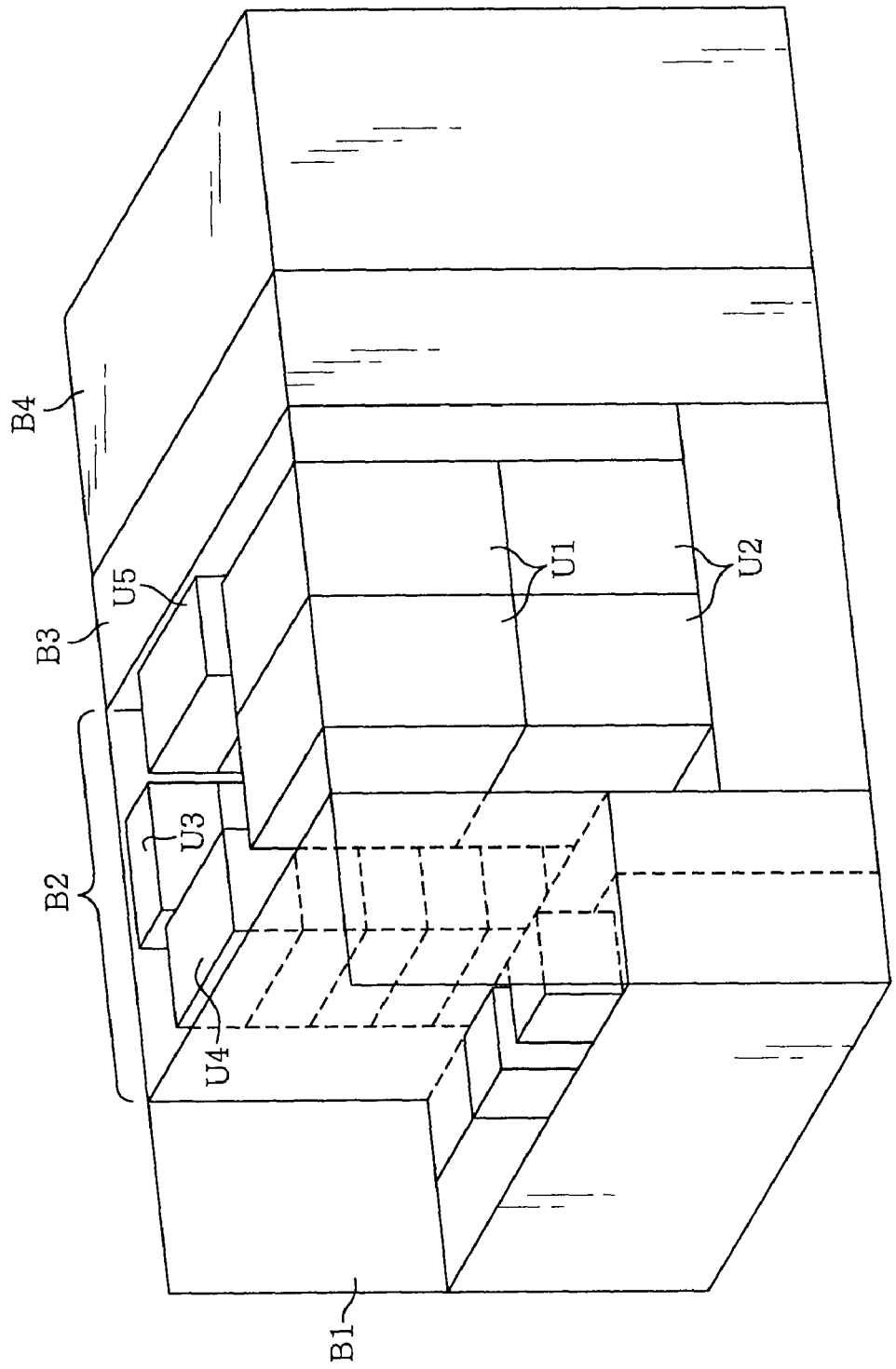
FIG. 16 offers a schematic perspective view of the coating/developing apparatus including the liquid processing apparatus of the present invention.

Hereinafter, a coating and developing apparatus incorporating a liquid processing apparatus of the present invention as a coating unit U1 will be described in detail with reference to FIGS. 15 and 16.

The reference numeral B1 represents a carrier block including a transfer mechanism 72 and a carrier mount 71 having a carrier 70 for accommodating a plurality of substrates G therein. A processing block B2 is connected with an inner side of the carrier block B1. Installed above the blocks B1 and B2 is a fan filter unit (FFU) (not shown) from which a clean air is supplied downward, thereby producing a descending flow of the clean air in each of the blocks B1 and B2.

A transfer arm 5 is installed in the processing block B2. To surround the transfer arm 5, as viewed from the carrier block B1, the coating unit (U1) and a developing unit (U2) for developing an exposed substrate are disposed on the right side of the transfer arm 5; a cleaning unit U3 for wafer cleaning, on the left side of the transfer arm 5; and rack units U4 and U5 each having a stack of heating/cooling units for providing heating/cooling of the substrate and a receiving/fetching unit for receiving and fetching the substrate, on the front and the rear side of the transfer arm 5, respectively.

The transfer arm 5 is capable of moving along directions of X-axis, Y-axis and Z-axis, and θ-rotation about Z-axis. Such arrangement enables the transfer of a substrate G among the coating unit U1, the developing unit U2, the cleaning unit U3, and the rack units U4 and U5. The processing block B2 is connected via an interface block B3 to an exposure block B4 for, e.g., exposing a substrate having a resist film formed thereon by using a mask. A transfer mechanism 73 is installed in the interface block B3 to enable a transfer of substrates G between a receiving/fetching unit (one of the racks in the rack unit U5) and the exposure block B4.

Flow of a substrate G in the apparatus will now be briefly described. First, the carrier 70 containing therein substrates G is carried into the carrier mount 71 from outside. Then, a single substrate G is extracted from the carrier 70 by the transfer mechanism 72 and the substrate G is transferred to the transfer arm 5 by a receiving/fetching unit (one of the racks in the rack unit U4). The substrate G is then loaded into the cleaning unit U3, a heating unit, a cooling unit, and the coating unit U1 in sequence to form, e.g., a resist layer, by the above described process. Next, the substrate G is subjected to a pre-baking in a heating unit, and is then cooled to a predetermined temperature in a cooling unit. Thereafter, the substrate G is loaded into the exposure block B4 by the transfer mechanism 73 where the substrate G is exposed. The substrate G is then transferred to a heating unit and a post-exposure baking process is performed thereon at a predetermined temperature. After adjusting a temperature of the substrate G in a cooling unit, the substrate G is developed in the developing unit U2. Finally, the substrate G having, e.g., a resist mask pattern formed thereon by the above process is returned to the original carrier 70.

Experiments were performed in order to verify the effects of the present invention and the result will be described in detail hereinafter.

Example 1

Figure 1A:
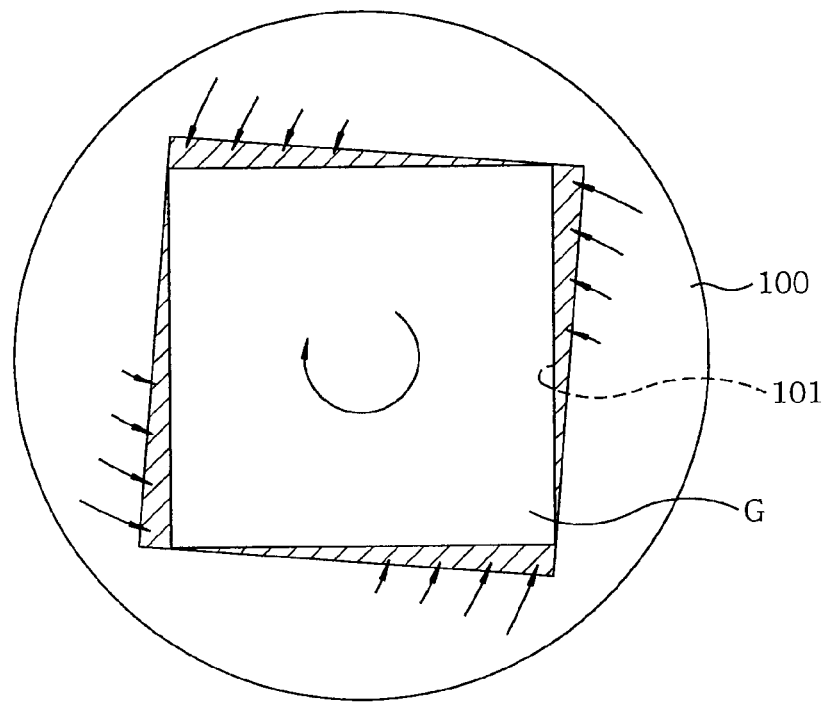
FIG. 1A is a schematic top view showing a case of a resist spin coating on a polygonal substrate by using a conventional apparatus.
Figure 1B:
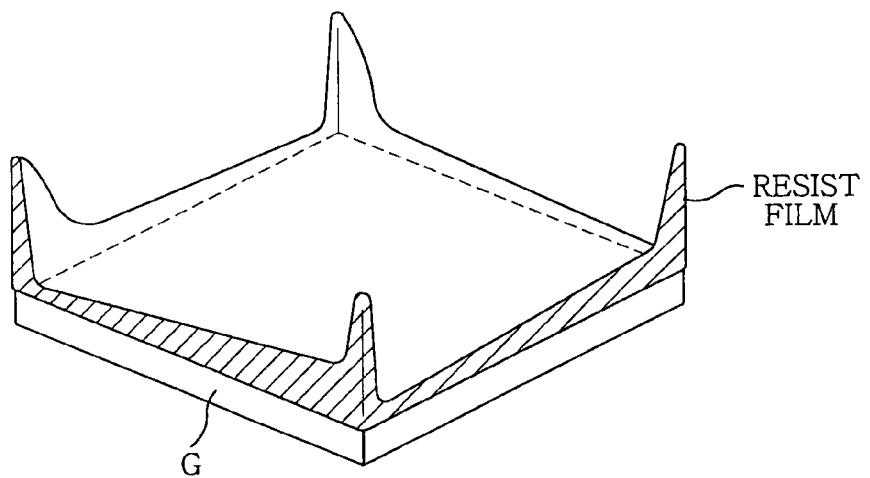
FIG. 1B shows a thickness distribution of the resist film formed on the polygonal substrate by the conventional spin coating process.

The present example employed the above-described method and the apparatus shown in FIG. 1 in forming a resist layer on a surface of a mask substrate G. First, the substrate G was mounted on a spin chuck and the resist solution film was formed in a high speed rotation process. The thinner contained in the resist solution was evaporated in a low speed rotation process to thereby obtain a resist layer.

A thickness of the resist layer formed on the surface of the substrate G was measured with a film thickness measuring device.

The process conditions were as follow:
(i) Dimensions of the substrate G: 152.4 mm×152.4 mm×6.35 mm (thickness)
(ii) Amount of coating solution supplied: 2 cc
(iii) High speed process: 2500 to 3200 rpm
(iv) Low speed process: 100 to 1000 rpm Example 2

Figure 14:
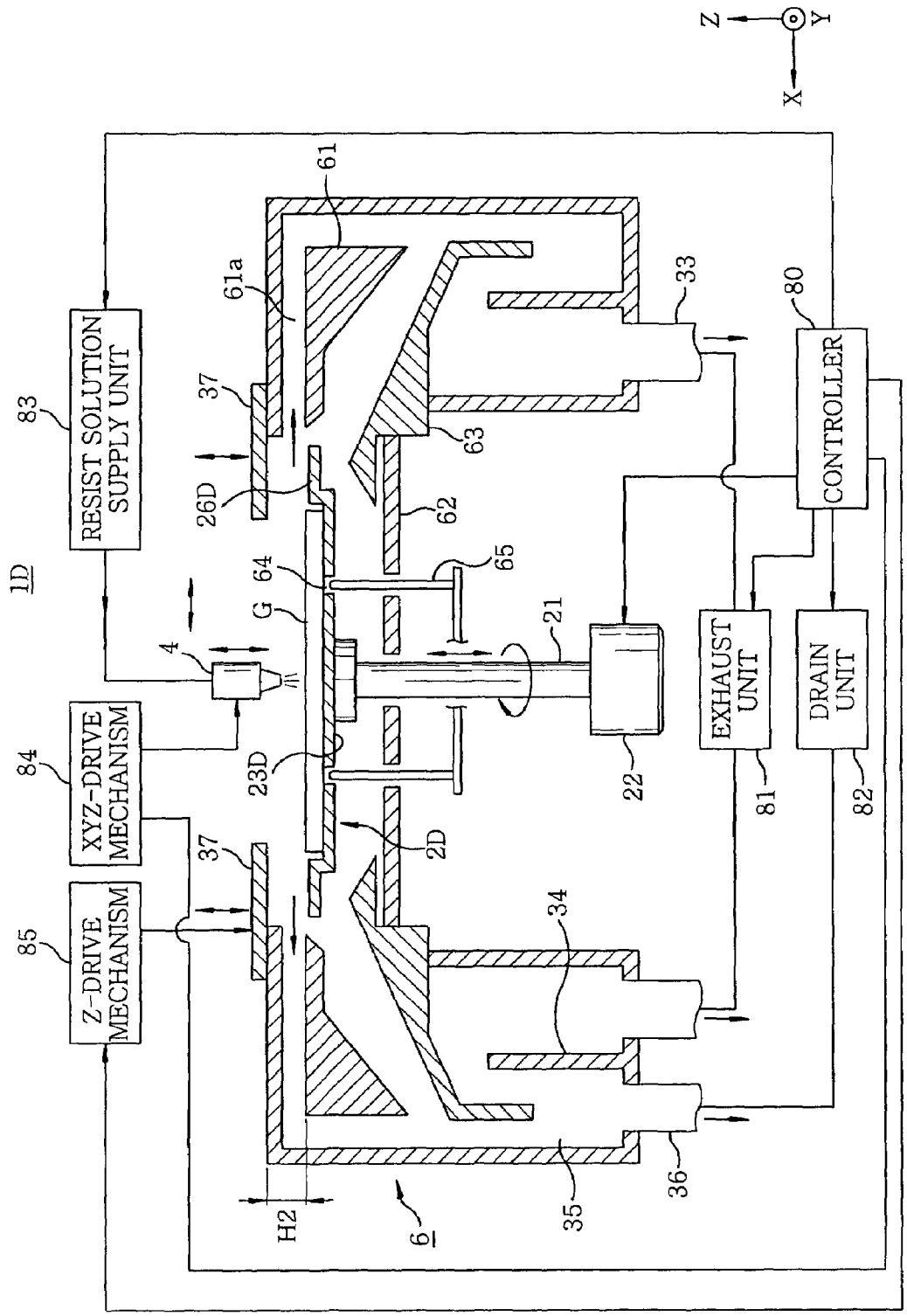
FIG. 14 describes a liquid processing apparatus in accordance with a second preferred embodiment of the present invention.

The present example employed the apparatus shown in FIG. 14 and all other conditions were the same as in Example 1.

Comparative Example 1

Comparative Example 1 employed a spin chuck disclosed in Japanese Patent Laid-open Publication No. 2000-271524 in coating a resist layer on a mask substrate G. Other conditions remain the same as in Example 1.

Results of Example 1, Example 2 and Comparative Example 1

Figure 17:
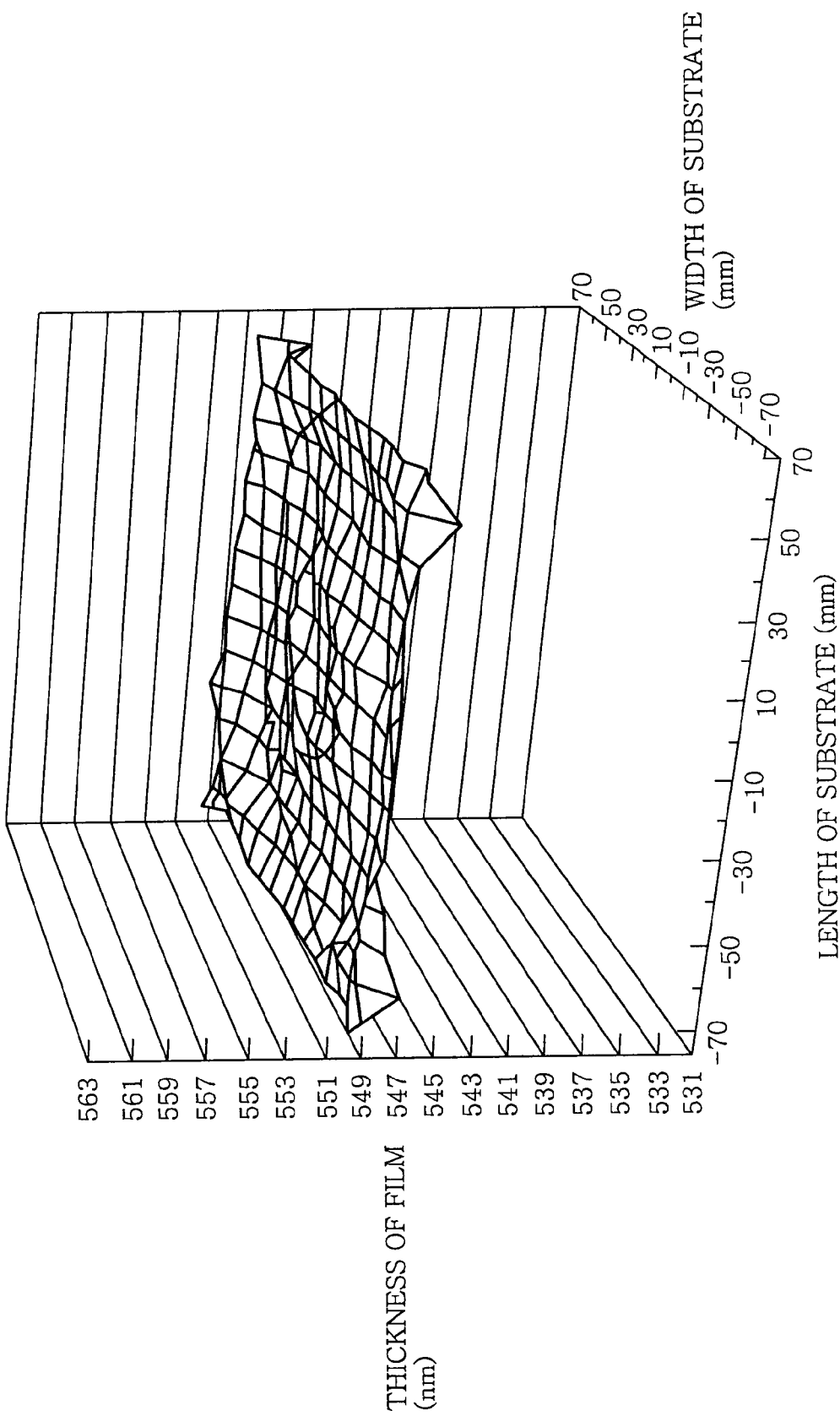
FIG. 17 is a graph three-dimensionally showing a thickness distribution of a resist film formed on the substrate by using a method of the present invention.
Figure 18:
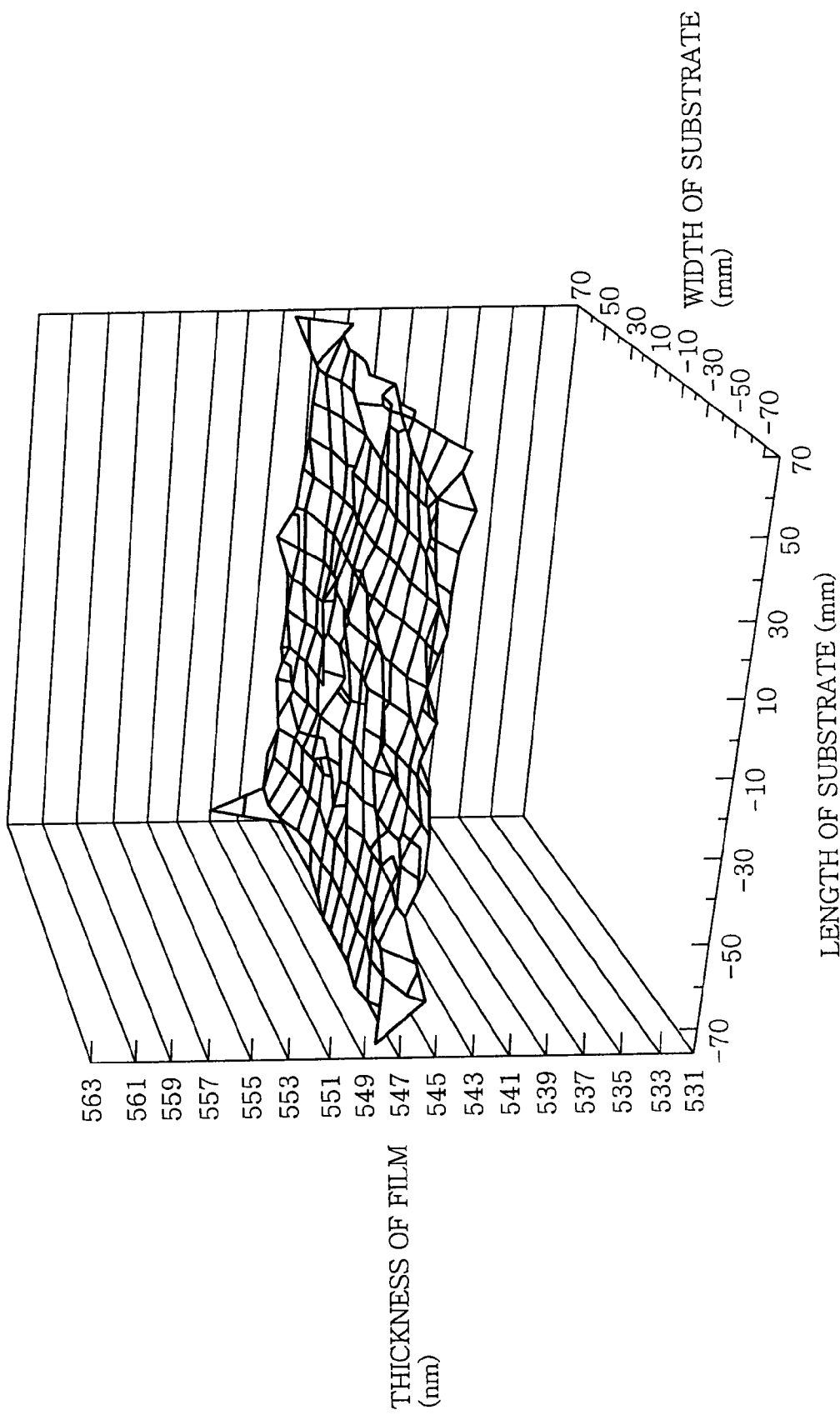
FIG. 18 provides a graph three-dimensionally showing a thickness distribution of a resist film formed on a substrate by using a method of the present invention.
Figure 19:
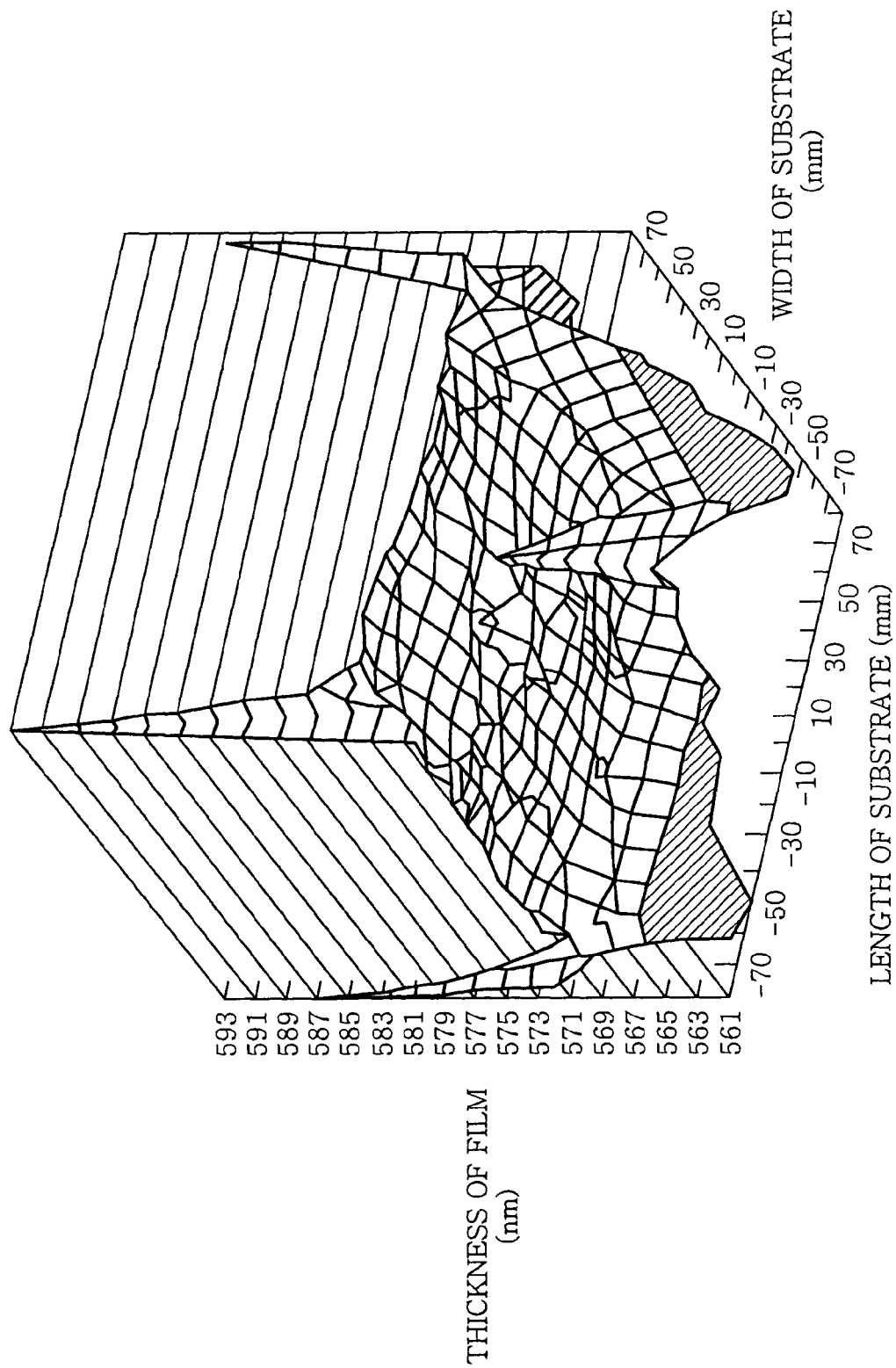
FIG. 19 is a graph three-dimensionally showing a thickness distribution of a resist film formed on a substrate by using a conventional method.

The thickness measurement result from Example 1 is illustrated in FIG. 17. The thickness measurement result from Example 2 is illustrated in FIG. 18 and that from Comparative Example 1 is illustrated in FIG. 19. The vertical axis represents the thickness of the resist layer (nm). It can be seen that in Example 1 increment in the thickness of the resist layer at corner portions of the substrate G is suppressed and a slanting of the thickness toward one direction at the side portions of the substrate G is suppressed as well. Also, in the results of Example 2, a uniform thickness can be observed at the corner portions and the side portions of the substrate G.

On the other hand, the resist layer obtained in the Comparative Example 1 shows an increase in thickness at the corner portions thereof, as well as a slant of the thickness at the side portions of the substrate G. In other words, it was verified that a highly precise thickness profile can be obtained by employing the spin chuck 2 not having the air flow control members 26 at the regions corresponding to the corner portions of the substrate G. Further, it was also verified that a highly precise thickness profile can be obtained by employing the air flow regulation ring 61.

In accordance with the liquid processing apparatus of the present invention, by installing air flow control members around a substrate except regions corresponding to corner portions of the substrate, a helical air flow including evaporative substance flowing from a center portion to a periphery of the substrate along the surface thereof is produced when the substrate is rotated. The helical air flow continuously flows through the top surfaces of the corner portions of the substrate. Accordingly, an increment in the film thickness at the corner portions of the substrate is suppressed and, in terms of thickness profile, high in-surface uniformity can be achieved. Moreover, by utilizing the corner portions of the substrate protruding in the cutout portions provided in the substrate supporting plate upon loading and unloading of the substrate by, e.g., a transfer arm, the loading and unloading of the substrate can be easily performed. As a result, even in a case of, e.g., repeated processing of the substrate G, a deterioration in throughput can be suppressed.

While the invention has been shown and described with respect to the preferred embodiments, it will be understood by those skilled in the art that various changes and modifications may be made without departing from the spirit and scope of the invention as defined in the following claims.

The invention claimed is:

1. A liquid processing method for forming a coating film on a polygonal substrate by spin coating in an ambient with a descending clean air flow, comprising the steps of:
    (a) supporting the polygonal substrate by a spin chuck and placing at least one air flow control member, which rotates with the spin chuck, along a periphery portion of the substrate except at corner portions thereof;
    (b) supplying a top surface of the substrate supported on the spin chuck with coating solution and centrifugally spreading the coating solution by rotating the spin chuck about a normal axle;
    (c) removing a part of the coating solution on the top surface of the substrate by rotating the substrate at a first rotating speed; and
    (d) evaporating solvent included in the remaining coating solution on the top surface of the substrate by rotating the substrate at a second rotating speed slower than the first rotating speed,
    wherein, when an area surrounded by a transfer arm is passed through the spin chuck transferring the substrate from the transfer arm to the spin chuck, the transfer arm is lowered relative to the spin chuck and support extrusions which support corner portions of the substrate are passed through cutout portions of the spin chuck and reach a region below the spin chuck, and
    wherein, at least in step (a), the corner portions of the substrate outwardly protrude from the spin chuck through the cutout portions of the spin chuck when the substrate is supported on the spin chuck.

2. The liquid processing method according to claim 1,
    wherein, at least in the step (d), in addition to an air flow produced by the rotation of the spin chuck, a horizontally outward air flow is produced from a periphery of the air flow control member.

3. The liquid processing method of claim 1, wherein in the step (c), the coating solution removed from the substrate during a rotation thereof is drained through a portion below the air flow control member.

4. The liquid processing method of claim 2, wherein in the step (c), the coating solution removed from the substrate during a rotation thereof is drained through a portion below the air flow control member.

5. The liquid processing method of claim 1, wherein at least in the step (d), a ring plate for controlling the descending clean air flow towards the substrate supported on the spin chuck is disposed above the air flow control member.

6. The liquid processing method of claim 2, wherein at least in the step (d), a ring plate for controlling the descending clean air flow towards the substrate supported on the spin chuck is disposed above the air flow control member.

7. The liquid processing method of claim 4, wherein at least in the step (d), a ring plate for controlling the descending clean air flow towards the substrate supported on the spin chuck is disposed above the air flow control member.

8. The liquid processing method of claim 3, wherein at least in the step (d), a ring plate for controlling the descending clean air flow towards the substrate supported on the spin chuck is disposed above the air flow control member.

* * * * *